United States Patent [19]
Purcell et al.

[11] Patent Number: 4,794,599
[45] Date of Patent: Dec. 27, 1988

[54] TEST APPARATUS FOR ELECTRONIC EQUIPMENT

[76] Inventors: Francis A. Purcell, 108, St. John's Park, Clondalkin, Co. Dublin; William G. Fenton, 25, St. John's Terrace, Carrick-on-Suir, Co. Tipperary; Matthew M. Collins, Doonan, Donegal, Co. Donegal, all of Ireland

[21] Appl. No.: 896,756

[22] Filed: Aug. 14, 1986

[30] Foreign Application Priority Data

Aug. 14, 1985 [IE] Ireland .................. 1998/85

[51] Int. Cl.⁴ ............................................. G06F 11/00
[52] U.S. Cl. .......................................... 371/20; 371/25
[58] Field of Search .................. 371/15, 16, 18, 20, 371/25, 27; 364/200, 900

[56] References Cited

U.S. PATENT DOCUMENTS

| 4,316,259 | 2/1982 | Albrecht | 371/27 |
| 4,348,760 | 9/1982 | Rice | 371/25 |
| 4,397,021 | 8/1983 | Lloyd | 364/200 |
| 4,402,055 | 8/1983 | Lloyd | 371/20 |
| 4,622,647 | 11/1986 | Sagnard | 371/20 |
| 4,656,632 | 4/1987 | Jackson | 371/20 |
| 4,658,400 | 4/1987 | Brown | 371/20 |
| 4,682,330 | 7/1987 | Millhom | 371/20 |

*Primary Examiner*—Michael R. Fleming
*Attorney, Agent, or Firm*—Ladas & Parry

[57] ABSTRACT

Portable test apparatus for tracing faults in electronic equipment including or associated with a microprocessor comprises a control module connectible to a test configuring module. The control module comprises a microprocessor, a data storage memory programmed to contain operating software associated with the microprocessor, a keyboard and visual display screen for enabling intercommunication between a user of the apparatus and the microprocessor, and a data bus for data transfer between the control module and the test configuring module. The test configuring module comprises a data storage memory programmed to contain a range of diagnostic tests specific to a particular type of electronic equipment to be tested and accessible by the microprocessor, and a latched data bus for data transfer between the test configuring module and the unit to be tested. Faults can be traced to a general area (RAM, ROM, I/O, etc.) using pre-programmed diagnositic analysis, and down to component level using static stimulus tests.

7 Claims, 38 Drawing Sheets

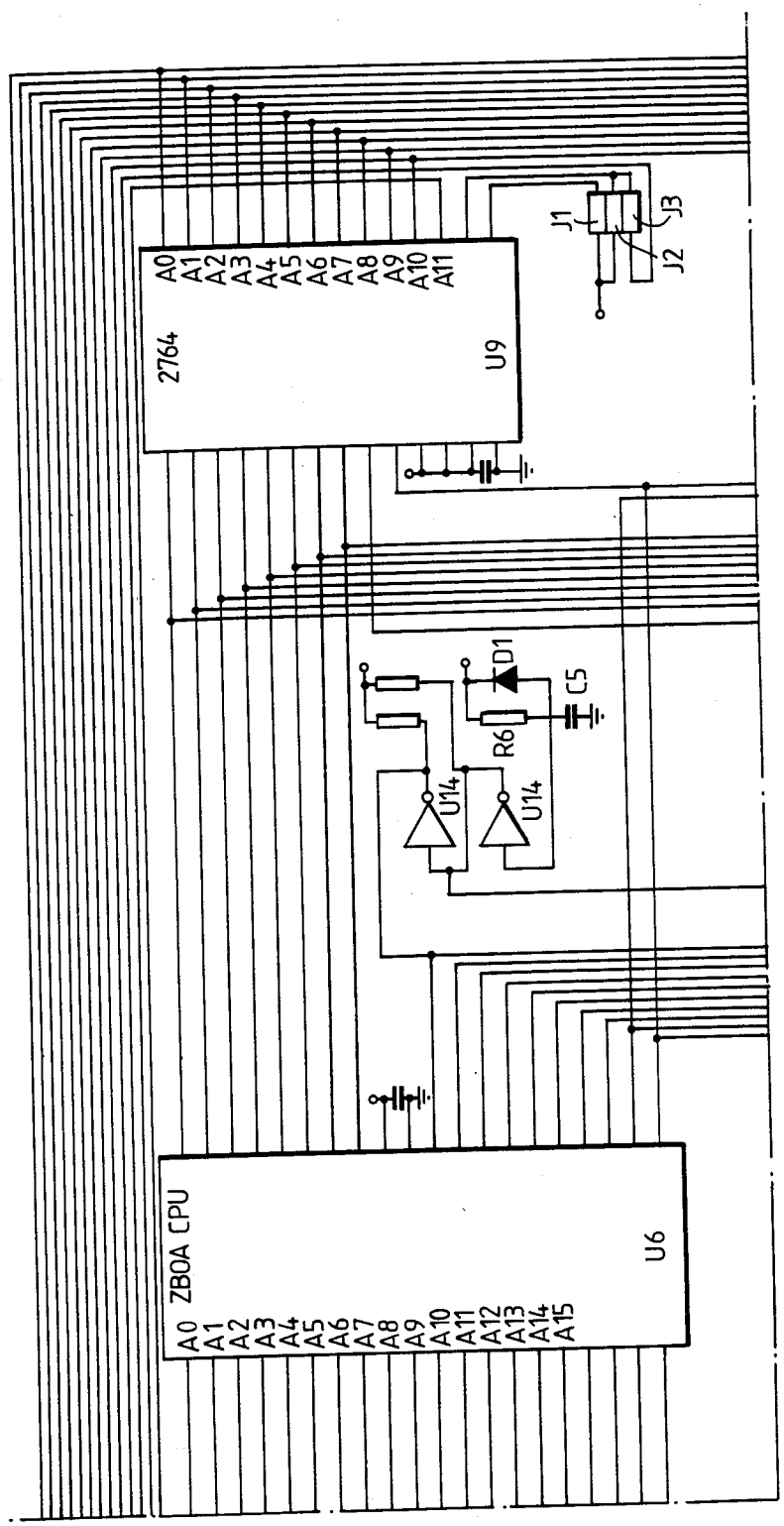

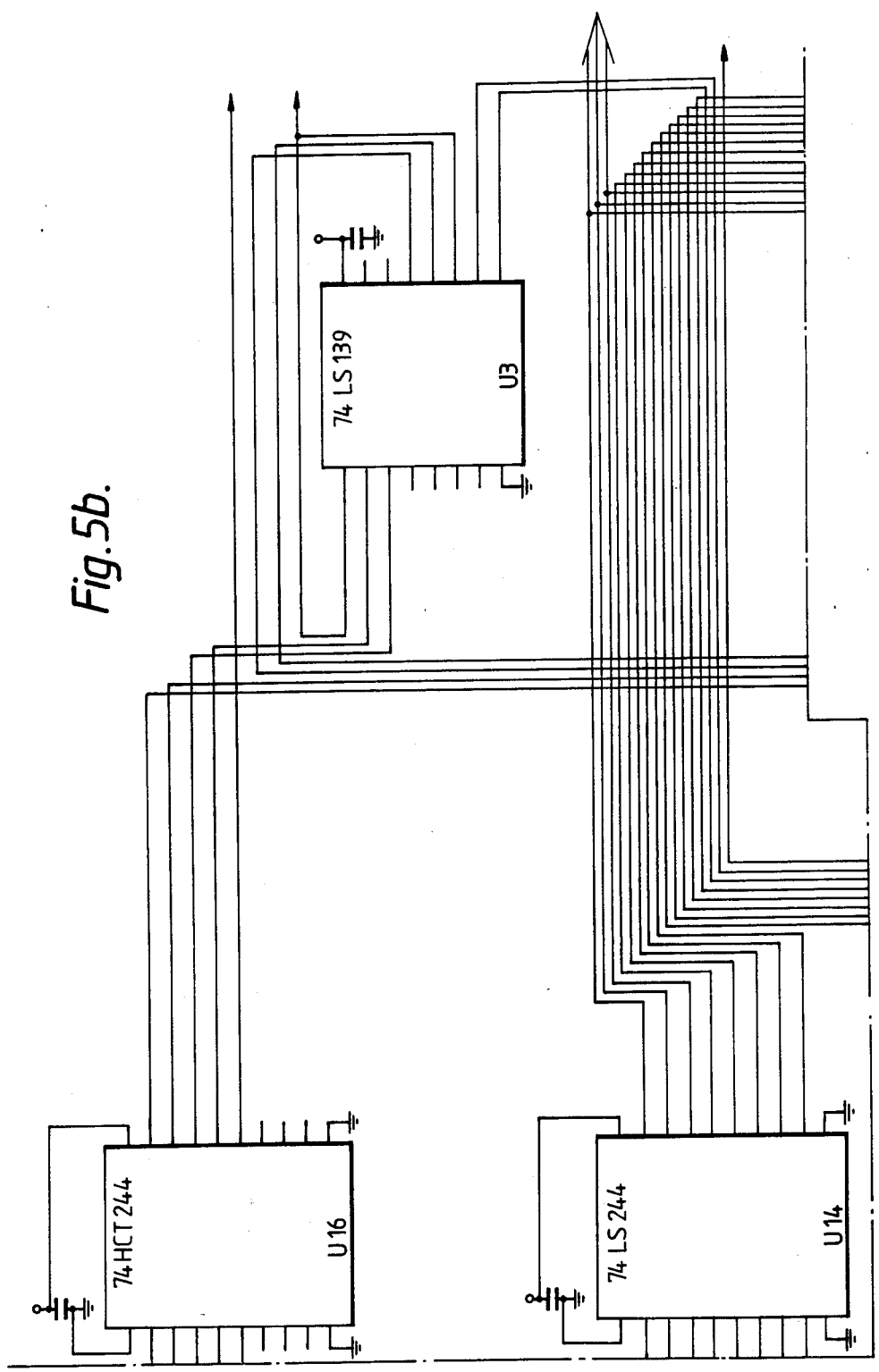

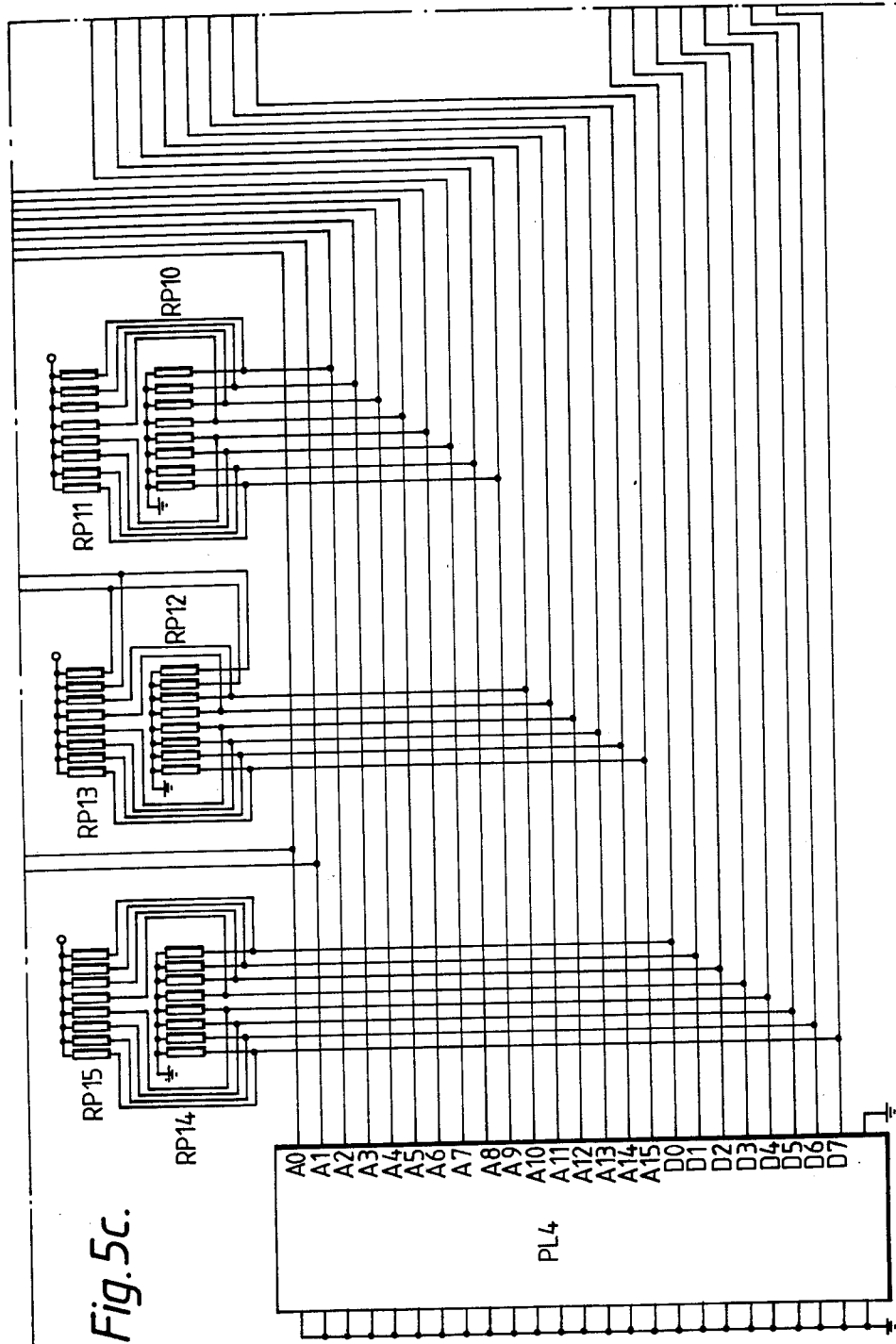

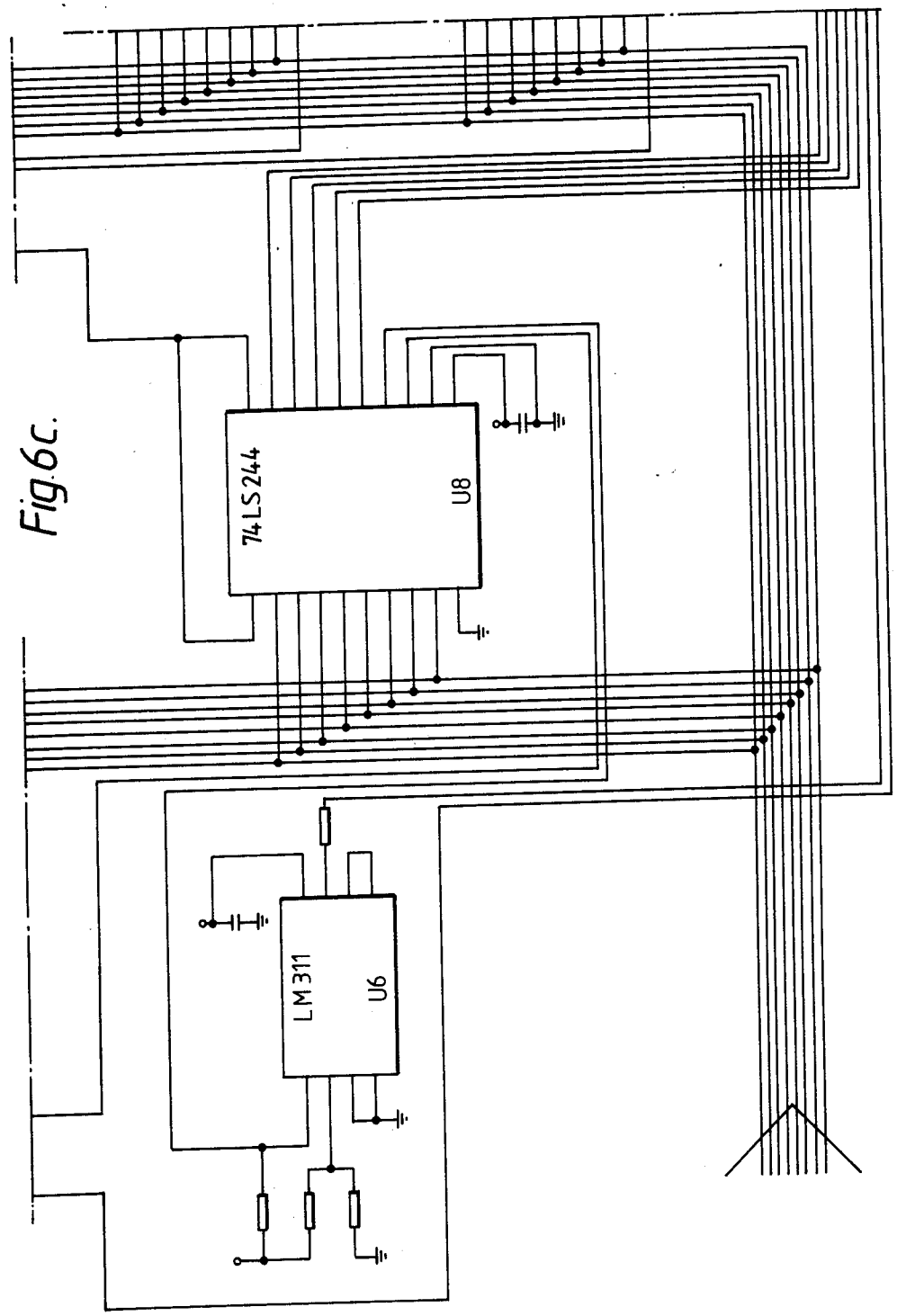

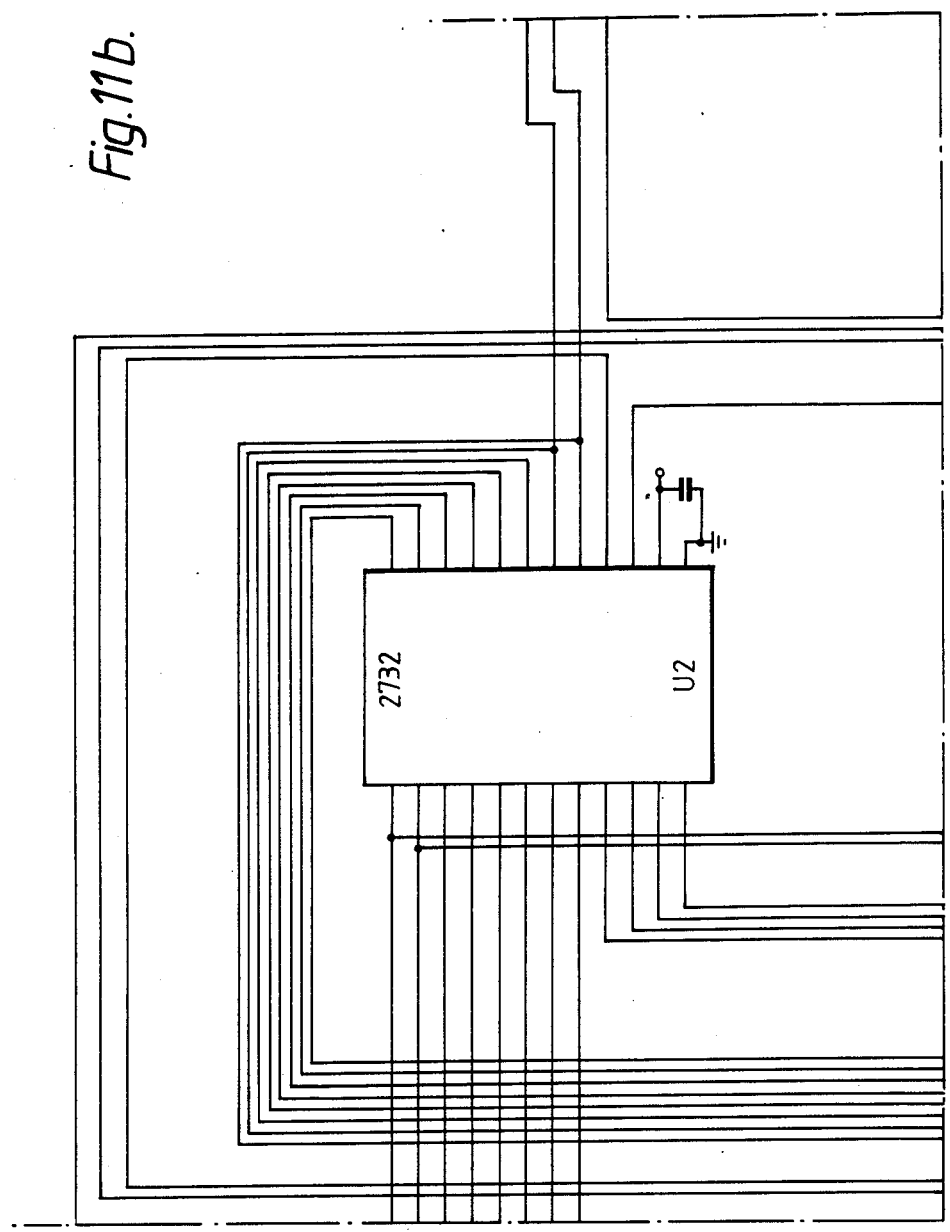

TEST APPARATUS FOR ELECTRONIC EQUIPMENT

FIELD OF THE INVENTION

This invention relates to test apparatus for electronic equipment. In particular the invention relates to portable test or fault-finding apparatus for equipment incorporating a microprocessor and also to test apparatus for data processing equipment.

BACKGROUND TO THE INVENTION

According to a recent survey of the U.S. electronics industry, the estimated cost to the industry in 1984 of circuit boards travelling from customer sites to field service depots, back to the factory for repair, and finally back to the customer, was over $10 billion. It was found that up to 35% of those circuit boards were not defective, due to inadequate field service test equipment and "blind swapping" of circuit boards to effect a quick temporary remedy. The survey concluded that the investment in inventory control and transportation to support blind board-swapping amounts to 10% of equipment sale price. This clearly illustrates the need for more effective test equipment to quickly and accurately pinpoint fault areas, and thus allow for more on-site repair and replacement of faulty circuit boards or components.

It is important in all troubleshooting situations to eliminate areas known to be fault-free as soon as possible, so as to narrow down the search. This process can be overly time-consuming when the equipment to be tested is treated as a whole. One of the first aims of the present invention is to allow the user to isolate particular segments of the hardware under test, for example a random access memory (RAM), a read only memory (ROM), or specific input/output (I/O) area, and to test those fully before elimination or inclusion in any further testing. This technique is known as "pre-programmed diagnostic analysis" (PPDA), which allows for a broad range of test functions that can be performed automatically in sequence with little or no user interaction.

Another important aim of the present invention is to provide an effective means of fault-finding down to component level. However, having isolated any fault to a particular area, one of the main problems associated with any further testing is the dynamic nature of the buses in any microprocessor-based equipment. The traditional prior art approach has been to exercise these buses dynamically, thus emulating the action of the microprocessor itself, but this has only met with varying degrees of success. The present invention utilises unique firmware (a combination of applications software and dedicated hardware components) with the ability to drive a normally dynamic bus (for example an address, control or data bus) with a predetermined static pattern set high (=1) or low (=0) permanently, which may be traced with ease through the unit of equipment being tested. A simple tool such as a logic probe may be used to trace a fault. This approach is termed "static-stimulus testing" (SST), which, in conjunction with pre-programmed diagnostic analysis (PPDA), makes a powerful means of troubleshooting microprocessor-based equipment.

Specialised test apparatus embodying the present invention comprises a combination of hardware components which is readily portable to the test site and which is designed to be suitable for testing a large number of different types of equipment. The system is designed for a simple set-up and ease of operation and requiring the minimum of training for field service personnel.

SUMMARY OF THE INVENTION

According to the invention there is provided portable test apparatus for tracing faults in electronic equipment including or associated with a microprocessor, which apparatus comprises a control means for providing an interface between a user of the apparatus and a test configuring means, a test configuring means communicable with the control means and with a unit of electronic equipment to be tested, wherein the test configuring means is adapted to configure the apparatus to test a particular type of electronic equipment by means of a pre-determined range of diagnostic tests specific to said type of equipment, whereby said test configuring means is interchangeable with any one of a plurality of such means each one adapted to configure the apparatus to test a different type of electronic equipment.

The control means may include a microprocessor, data storage means, input command means for enabling a user to communicate with said microprocessor, output display means, and input/output means for data transfer between the control means and a configuring means with which it is associated.

Each configuring means may include data storage means and input/output means for data transfer between the configuring means and a unit of electronic equipment to be tested and between the configuring means and the control means of the apparatus. The data storage means of the apparatus may contain one or more test programs. Preferably, the test programs provide for pre-programmed diagnostic analysis (PPDA) combining a range of automatic tests which rapidly isolate a fault area in the unit to be tested. Advantageously, firmware is also provided for static stimulus testing (SST) to statically drive and/or sense individual or groups of normally dynamic buses in the unit to be tested to enable a fault therein to be traced to component level.

Individual configuring means may be provided each of which is dedicated to perform a series of fault-finding operations specific to, inter alia.

microcomputers, for example based on any one of the following microprocessors; Z80, 8088, 6502, 6800, 6802, 6809, 8048, 8080, 8085, 8086, 9900 and 68000, and peripheral devices including, inter alia, floppy disk drives,
Winchester (hard) disk drives,
printers with a Centronics interface,
printers with an RS232C port,
data communications equipment,
data communications testers (all protocols),
data communications links, including IEEE 488 buses,
other test apparatus for microprocessors,
modem testers, and
LAN analysers.

Each configuring means of the apparatus may be associatable with the control means thereof by an interconnection including a multi-wire cable semi-permanently connected to the configuring means and terminating at its end remote from the configuring means in connecting means for association with the control means. The control means and the configuring means are preferably connected using two 50-way delta ribbon connectors.

Each configuring means of the apparatus may also be associatable with equipment to be tested by means of an interconnection including a multi-wire cable semi-permanently connected to the configuring means and terminating at its end remote from the configuring means in connecting means for association with a unit of electronic equipment to be tested.

In an especially preferred embodiment, the apparatus provides a readily portable multipurpose instrument, capable of testing a whole range of electronic equipment on site down to component level, thus allowing on site repair which in many instances obviates the very costly practice of blind circuit board swapping, or of circuit board return for factory repair. The need for traditional test gear such as oscilloscopes, logic analysers, etc. may be largely dispensed with, the apparatus of the invention combining or replacing the functions of all of these instruments.

In this favoured portable embodiment of the invention, the apparatus may be carried in a standard briefcase and used conveniently and efficiently by engineers on field service calls. All the test equipment, ancillary tools, selected spare components and materials an engineer requires may thus be carried in a single briefcase.

Each functional unit of test apparatus thus consists of two devices, a control module and a test configuring module.

The control module is thus adapted as a miniature stand-alone terminal and consists of a keyboard and a multiline alphanumeric liquid crystal display (LCD). The control module essentially acts as a user interface to the test environment, and allows the user to control the hardware environment by mean of "menu-driven" control software and firmware associated with the configuring module. A printer port for optional hard copy output is included.

Each test configuring module configures the control module for a particular test environment, i.e. to test a particular dynamic segment of hardware or the entire operating functions of a particular item of hardware equipment. The configuring module plugs into the control module, and via another connector to an appropriate position in a circuit board of the unit under test. Different configuring modules are used for different types of equipment, thus providing a flexible system of "add-ons" to suit customers' needs.

In another aspect, there is provided according to the invention, a method of testing electronic equipment using apparatus according to the foregoing aspect of the invention, in which an item of electronic equipment to be tested is associated with a said configuring means, said configuring means is associated with the control means of the apparatus, inputs are applied to said item of equipment by said control means and the response of said item to said inputs is monitored by said control means.

BRIEF DESCRIPTION OF THE DRAWINGS

An embodiment of test apparatus for electronic equipment according to the invention is now described, with reference to the accompanying drawings, of which:

FIGS. 4 and 4a–4h show a circuit diagram of the control module's main circuit board, FIGS. 5 and 5a–5e and 6 and 6a–6e together show a circuit diagram for a test configuring module adapted to test equipment incorporating a Z80 microprocessor, FIGS. 7 to 10 together show a flow chart representation of software for a test configuring module adapted to test equipment incorporating a Z80 microprocessor, FIGS. 11 and 11a–11e a circuit diagram for a configuring module adapted as a Centronics printer exerciser.

DETAILED DESCRIPTION OF PREFERRED EMBODIMENT

Figure 1:
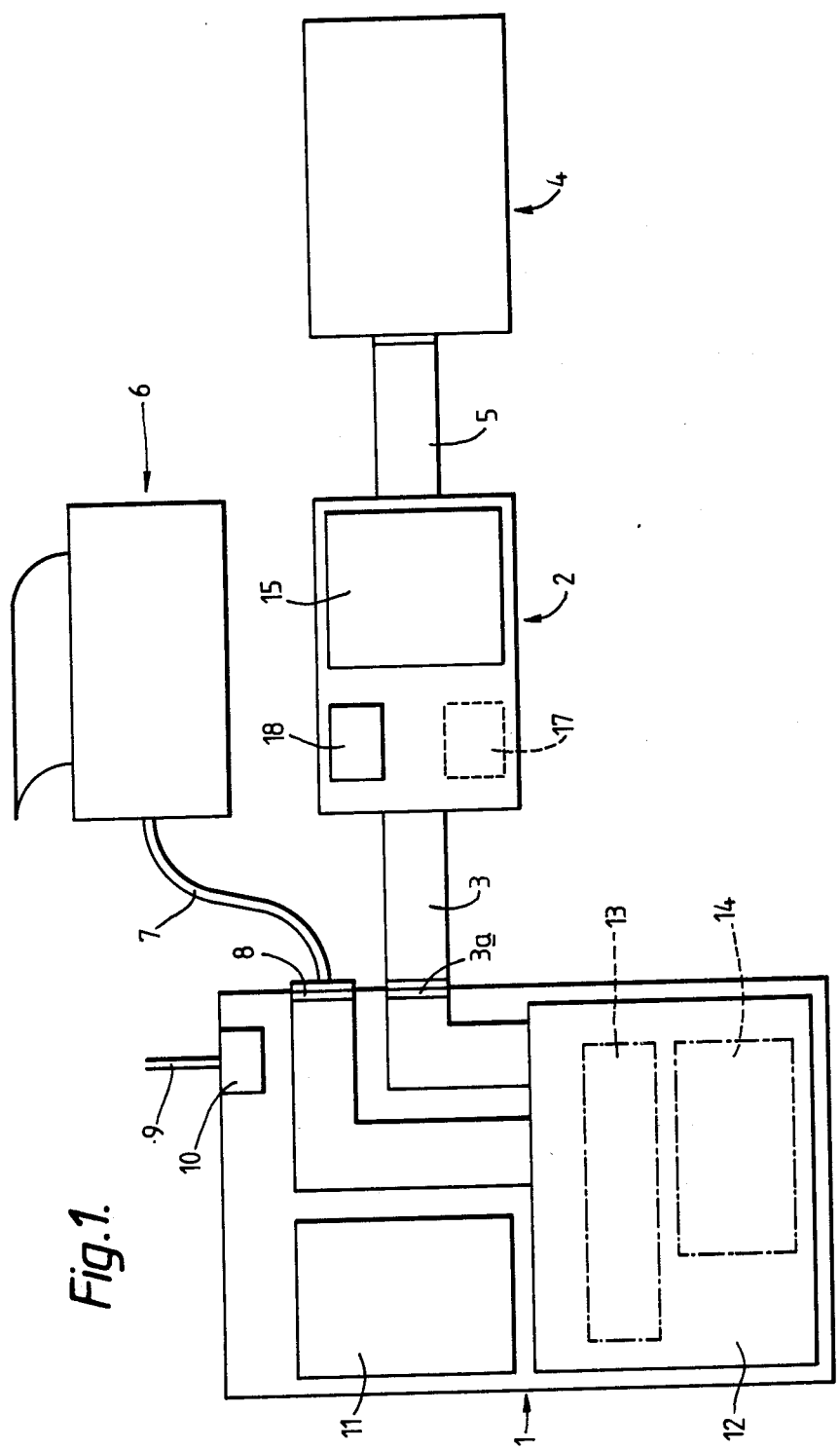
FIG. 1 is a schematic block diagram of apparatus of the invention in a test configuration.
Figure 2:
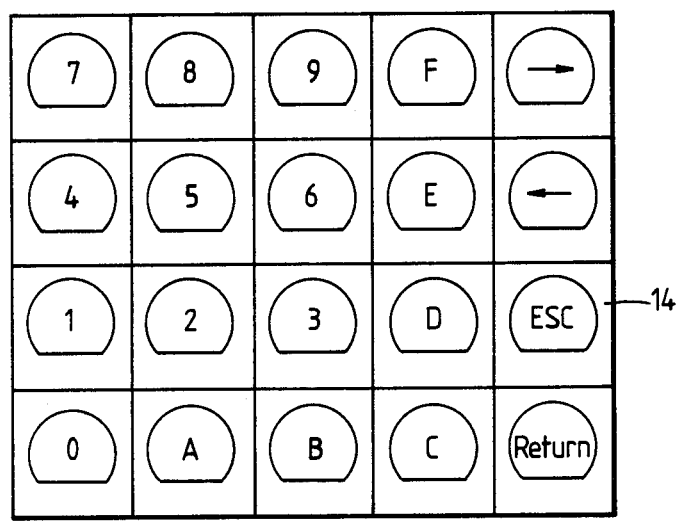
FIG. 2 shows a keyboard layout for the control module of the apparatus of FIG. 1.
Figure 3:
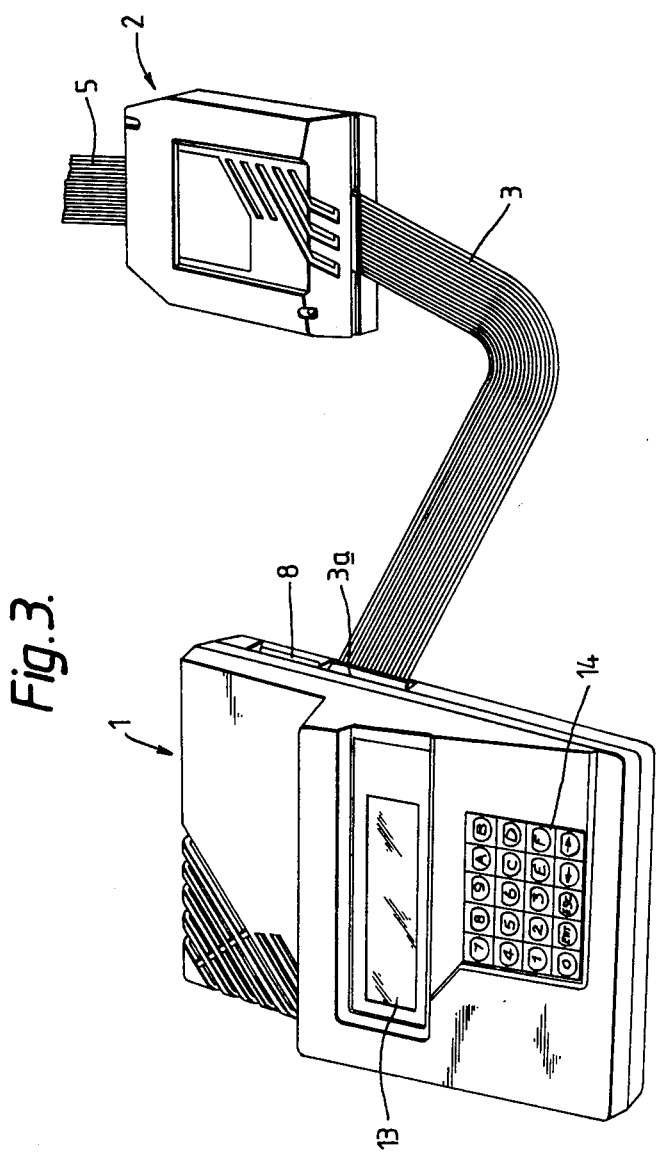
FIG. 3 shows a perspective view of a control module linked with a test configuring module, in accordance with an embodiment of the invention.

As shown in FIGS. 1 to 3, test apparatus according to the invention includes a control module 1 and a configuring module 2, interconnected by a communications link 3 which plugs into the control module via dual micro bus connector 3a. Apparatus 4 under test is in turn linked to the configuring module 2 by link 5.

A printer 6 may optionally be connected to control module 1 via link 7 to a printer port 8, e.g. a Centronics port, for generating hard copy of diagnostic results, if desired. The main components of the control module 1 include a mains supply (e.g. AC 100 V, 120 V, 220 V, 240 V; 50–60 Hz, 30 W max.) inlet 9 with filter and fuse holder 10, switch mode power supply unit 11, and a microcomputer circuit board 12 (see FIG. 4 also). A multiline liquid crystal display (LCD) 13 and a 4×5 key keypad 14 are also provided.

The test configuring module 3 typically comprises input/output (I/O) circuitry 15 with parallel I/O ports (SIO/CTC), a read-only memory (ROM) 18, or erasable programmable read only memory (EPROM), for storing pre-programmed diagostic tests, and optionally a non-volatile random access memory (NV RAM) 17 which can be used to store system parameters such as memory maps and user-customised test programs.

The keypad 14 comprises two groups of keys; (a) hexadecimal keys (0 through 9, A through F) and (b) control keys (Escape ("ESC") and Return ("RET") or Enter ("ENT"), and right and left arrows providing functions dependent upon which test configuring module is in use. The control keys may be distinguished by a different colour. Two alternative key layouts are illustrated in FIGS. 2 and 3. The relatively small number of keys, in particular function keys, makes the system easier to use and learn and is only made possible by the "menu-driven" nature of the operating software. Output messages displayed on the LCD are in plain English, eliminating the need for service personnel to learn programming languages or to memorise tedious fault codes. Thus, the whole system is designed to be "user-friendly".

The apparatus also provides an area of battery-powered non-volatile RAM, which can be used to store user-defined strings of more regularly used diagnostic routines.

Figure 4:
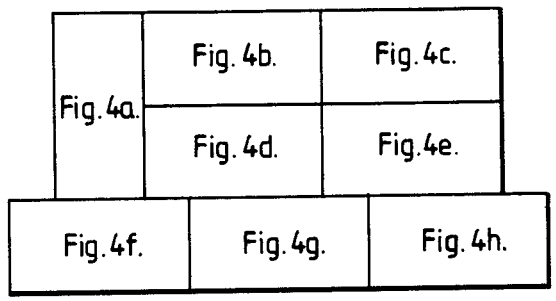

The control module 1 will now be further described by reference to its main hardware and software components and by reference to FIG. 4 of the drawings.

HARDWARE

The central unit is a Z80 based microprocessor card, consisting of:

2 KBYTE/4 KBYTE/8 KBYTE boot up ROM (stop selectable) to hold operating software.

2 KBYTE static RAM.

EPSON EG2401-AR-256×64 dot graphics LCD display.

I/O mapped E1330 LCD display controller with 8 KBYTE independent static display RAM.

I/O mapped Centronics printer port.

I/O Keyboard input.

Buffered Z80 bus to the test configuring module.

Boot Up ROM U9

Memory address range 0000H to 1FFFH

The boot up software can be stored on a 2 KBYTE 250 nS EPROM such as the INTEL 2716-25. To allow for future updating this 5 socket can accomodate 2716, 2732 and 2764 EPROMS. The jumper pins associated with this socket are labelled J1 to J3 inclusive.

For operation with a 2716 type EPROM a jumper socket is placed on J2 and J3.

For operation with a 2732 type EPROM a jumper socket is placed on J1 and J3.

For operation with a 2764 type EPROM a jumper socket is placed on J1.

RAM U11

Memory address range 2000H to 3FFFH.

This IC is a 250 nS static RAM such as the 6116-25.

8255A-2 U8 (Parallel Peripheral Interface)

I/O address range 0H to 3FH.

This IC is connected to the keyboard and a Centronics printer output and controls the keyboard and printer interface. On power up it is initialised such that ports A and C are outputs and port B an input. Port A is used to output data via a buffer U5 to the Centronics port for hardcopy output of error messages. The associated handshaking is performed using port C bit 0 to strobe the data and port B bit 5 to read the busy signal from the printer. Port C bits 4 to 7 inclusive output a 'Walking Zero' to the keyboard which is read by port B bits 0 to 4 inclusive. Debouncing of the switches is under software control. Port B bits 0 to 4 are pulled high by resistor network labelled RP3. A buzzer (piezo-electric tweeter) is also connected to 8255 and is controlled by port C bit 1 via an inverter U14. A logical 1 on this bit causes the buzzer to sound.

E1330 LCD Controller U10 and display RAM U12

I/O address range 40H to 80H.

This IC is a surface mounted device to control the LCD display. The associated RAM, U12, is independent of the Z80 bus and can be accessed only via the controller. This RAM is jumper selectable to configure the socket to accept a 6116-35 or 6264-35 type static RAM. For operation with a 6116 type RAM a jumper socket is placed on J5. For operation with a 6264 type RAM a jumper socket is placed on J4. The display signals are output via the 14 sil header, PL2. The trimmer VR1 varies the contrast of the LCD display, and it is worth noting that this trimmer can blank out the display.

DECODING

The Z80 microprocessor produces control signals to allow both memory and I/O mapping. The majority of the decoding is done on the control module by a 74LS139 dual 2 to 4 decoder labelled U7. The memory addresses are divided into 2×8K blocks for ROM and RAM and the remaining 48K is defined as external to the control module. This is achieved by logically 'or'-ing the address lines A15 and A14 and using the result together with A13 to decode the RAM, ROM and external blocks. The logical 'or' function is achieved by using one 'and' gate and three inverters to give the following function:

$$A+B=\overline{A.B}$$

The I/O mapping is divided into 2×64 byte blocks for the LCD controller and the 8255. The remaining 128 bytes are defined as external to the control module. This is achieved by using the 74LS139 to decode address lines A7 to A6.

External and internal definitions as possible due to the data bus transceiver U4. This transceiver is enabled only when the memory address is greater than 3FFFH or when the I/O address is greater than 7FH. The selection of a memory address or an I/O address greater than the above limits, causes one of the four decoding lines 1Y2, 1Y3, 2Y2, 2Y3 from the 74LS139 to go low. These four signals are logically 'and'-ed causing the line labelled CS5 to go low. The transition of this line is delayed by routing it through two inverters (U18) to allow proper hold times to be maintained on data when using latches externally.

BUS BUFFERS

All output and input signals are buffered by permanently enabled line drivers, U1, U2, U3, U17. All input signals are terminated using resistor networks labelled RP1 and RP5. The data bus is buffered by a transceiver, U4, the direction control of which is selected by the RD signal from the microprocessor. The enable is controlled by decoding as described previously. The data lines are terminated using resistor networks labelled RP2 and RP6.

CLOCK CIRCUITRY

The clock circuit requires a parallel resonant type xtal, of fundamental frequency 3.68 MHz. The flip flop U16 is required to give a 50% duty cycle. R5 is in series with the clock signal to reduce overshoot.

MISCELLANEOUS CIRCUITRY

D1, D6 and C5 in conjunction with two inveter gates of U14 realise the active high and active low reset signals.

R4 is a current limiting resistor for the 'power on' LED on the keypad.

Software

The software on the control module consists of the following routines:

(a) Initialisation (b) System self-test Diagnostics (If a fault is found an equipment failure message is outputted).

(c) Display Driver Programs (d) Keyboard Driver Programs (e) Printer Driver Programs (f) Data input Programs
(g) A program to check if the test configuring module is plugged in and functioning.
(h) The following message is then outputted:
'UUT powered up'. [UUT=unit under text]
'Press <ENTER> to continue'

On <ENTER>, the programs specific to the particular test or configuring module are executed. These are contained in the control module.

The various routines outlined are used by configuring module software to control display, data input etc.

A variety of test configuring modules is provided, an exemplary selection of which is now described.

A. MICROCOMPUTER TEST CONFIGURING MODULES

Test or configuring modules are provided for all common microprocessors including:
1. Z80
2. 6502
3. 8088

Hardware (General)

8K, 16K EPROM (Strap Selectable) to hold control software.

2K non-volatile RAM to permanently store memory maps and user test sequences.

Output latches for address and control buses (using standard transistor-transistor logic (TTL) series components).

Bidirectional port for data bus.

Input buffer for input control signals.

Circuit to check presence of clock.

Comparator to check that power supply is greater than 4.5 V

In order to interconnect the test configuring module to a unit under test (UUT), a ribbon cable extends from the module and terminates in a DIP plug (40-way) or similar. The microprocessor chip is removed from the UUT, and the DIP plug inserted. A DIP socket is placed between the plug and the microprocessor socket, acting as a dummy to prevent excessive wear, the dummy being removed and replaced after a predetermined period of use. The combination of the control module and the test configuring module is then ready to take over, perform and test all the microprocessor functions and to test its interaction with the remaining circuitry of the unit under test. It should be emphasised that the actual microprocessor chip itself is not subjected to any test since the likelihood of any inherent IC defects in the chip itself is extremely remote.

Hardware (Example for Z80 microprocessor test configuring module)

Figure 5:
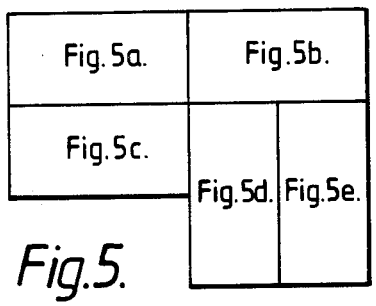
Figure 6:
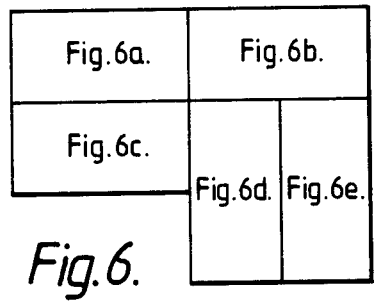

This is illustrated with reference to FIGS. 5 and 6 of the drawings, and comprises the following components.

HARDWARE DESCRIPTION

The Z80 test configuring module is a static tester. All address lines and output control lines are latched out. All inputs are read from tristate buffers.

The test configuring module consists of 8 KBYTE of ROM, 2 KBYTE of battery backed up RAM, output latches and input buffers.

ROM U2

Address range 4000H to 5FFH.

This IC is a 2764-25 type EPROM containing the software for the test configuring module.

RAM U1

Address range 6000H to 7FFFH.

This is a 6116-25 equivalent non volatile RAM.

INPUT/OUTPUT

All I/O on this test configuring module is memory mapped, the address range is from 8000H to 8007H.

Address output least significant byte. The output address lines A0 through A7 are latched out via U11 at address 8000H. The output of this octal flip flop is buffered with a HCT type line driver, U19. The output to the UUT is short circuit protected with 100 Ohm series resistors, RP2, RP3 and RP4.

Address output most significant byte. The output address lines A8 through A15 are latched out via U12 at address 8001H. The output of this octal flip flop is buffered with a HCT type line driver, U20. The output to the UUT is short circuit protected with 100 Ohm series resistors, RP4 and RP5.

CONTROL OUTPUTS

The output control lines RD, WR, MRQ, IORQ, RFSH, M1 HALT, BUSAK are latched out via U13 at address 8002H. The output of this octal flip flop is buffered with a HCT type line driver, U21. The output of the U.U.T. is short circuit protected with 100 Ohm series resistors, RP5, RP6 and RP7.

DATA OUTPUTS

The output data lines D0 through D7 are latched out via a U10 at address 8003H. The output of this octal flip flop is buffered with a HCT type line driver, U21. The output to the U.U.T. is short circuit protected with 100 Ohm series resistors, RP1 and RP2. U21 is tristated when the data is being read in from the UUT. The output of 1Q of U4, a D type flip flop, is used to control the data output buffer.

DATA INPUTS

The data to be read from the UUT is buffered using a tristate 74HCT244, U9. The address of this buffer is 8006H.

UUT LOW VOLTAGE

The voltage of the UUT is compared to a set value of approx 4.5 volts by the comparator U6. For less than 4.5 volts the output of the comparator is low. If the probe is not connected, the input floats high and the comparator output is high.

UUT CLOCK

The UUT clock is used to latch the output Q2 of U4 through the flip flop U5. The output of U5 is read by the microprocessor through the buffer U8.

INPUT CONTROL SIGNALS

The microprocessor monitors the input control signals from the UUT via buffer U8.

Software

The software performs the following functions:
1. On initialisation, it checks the following:
   (a) Power
   (b) Clock
   (c) Input Control Signals
   If anything is found to be incorrect, a suitable error message is outputted.

2. The first menu is outputted. The sequence functions of the software are further illustrated with reference to FIGS. 7 to 10.

MICRO TESTER

0: Pre-Programmed Diagnostic Analysis (PPDA)
1: Static Stimulus Tests (SST)
2: Memory Map Mode
3: Test Sequence Mode

SELECT MODE?

The user types a number corresponding to the required option.

If '0' is typed the following menu is entered:

| (Example shown for Z80) Z80 PRE-PROGRAMMED DIAGNOSTIC ANALYSIS | |
|---|---|
| 0 RAM Test (Short) | 5 Dump Memory |
| 1 ROM Test | 6 Read I/O |
| 2 0,1, in Sequence | 7 Write I/O |
| 3 RAM Test (Long) | 8 Printer <off> |
| 4 R/W Memory Location | |

SELECT OPTION?

On Selection of an option from this menu:

0: RAM TEST (Short)

Prompts for RAM address. Inputted by user or fetched from memory map file. Each bit of each location is checked for read-write ability. If errors are found, the error address and bit status message is displayed. This message takes the form '+' for an error free bit, 1 for a stock high bit, 0 for a stuck low.

e.g. Addr: 1800 1+++00++

Error report indicates nature of fault (i.e. whether fault due to address decoder, bus drivers, etc.) Dynamic RAM may often be checked depending on configuration.

1: ROM TEST

User prompted for address and checksums or memory map file used. Up to four separate blocks can be defined. Test consists of adding all ROM bytes together and comparing total with required checksum. If the comparison is not positive an error message is outputted.

2: 0,1, IN SEQUENCE

Combines first two tests as one. Result will indicate to user whether fault lies in RAM or ROM.

3: RAM TEST (LONG)

This is a complex RAM test for locating pattern-sensitive problems. As with RAM test (Short) user is prompted for address or a memory map file is used. The full ramp pattern (i.e. 0, 1, 2, ... 255) is checked on each location. If an error is found the address and error pattern are displayed.

4: R/W MEMORY

Allows user to read and modify memory locations.

5: DUMP MEMORY

Allows user to dump block of memory in hex and ASCII.

6: READ I/O LOCATION

User specifies port address and port contents are read and displayed.

7: WRITE I/O LOCATION

User specifies port and data. Data is written to port.

8: PRINTER

Selecting this option toggles the printer on/off. Error messages, memory dumps etc. will be outputted to printer, if it is turned on.

On '2' being typed from the main (i.e. MICRO TESTER) menu the following mode is entered and the menu below displayed:

| (Example shown for Z80) Z80 STATIC STIMULUS TESTER | | |
|---|---|---|
| 0 Addr <0000> | 6 RFSH <1> | RESET = 1 |
| 1 Data <0-00> | 7 M1 <1> | WAIT = 1 |
| 2 MREQ <1> | 8 HALT <1> | INT = 1 |
| 3 IORQ <1> | 9 BUSAK <1> | NMI = 1 |
| 4 RD <1> | | BURSQ = 1 |
| 5 WR <1> | | |

SELECT OPTION?

Static tests allow permanent patterns to be output on the buses and their effects examined using a simple tool such as a logic probe or pulser.

On Selection of Option:

'0': Address O/P can be changed.
'1': Data bus changed in or out.
'2'–'9': Selection toggles signals.

All bus inputs are monitored and are constantly updated onto the display.

The right hand side of the display shows the input control signals. These are checked frequently and updated if required. Mode 0's pre-programmed tests are used to isolate the fault area (RAM, ROM or I/O) and the static tests may then be used to bring the fault down to component level.

On selection of option 2 in the main (i.e. MICRO TESTER) menu the following mode is entered and the menu below outputted:

| (Example for Z80) Z80 MEMORY MAP MODE |
|---|
| 0 Find Map |
| 1 Input Map |
| 2 Select Map |
| 3 Display Map |
| 4 Delete Map |

SELECT OPTION?

System parameters such as memory maps (ROM and RAM) of a computer known to be fault-free may be inputted and stored for future use in a non-volatile RAM, if system documentation is not available. Thus, a user may customise a test program for specific units under test based upon a memory comparison.

On selection of Option:

Option '0': The memory of the plugged in computer (fault-free) if examined and a memory map formed. This may be stored in non-volatile RAM for future use.

Option '1': Allows entry of memory map and storage in non-volatile RAM for future use.

Option '2': Allows selection of previously stored map for current use.

Option '3': Displays currently selected map.

Option '4': Deletes previously stored map.

Up to ten maps may be stored (names; 0-9).

When option 3 is type from the main (i.e. MICROTESTER) menu the following mode is entered and the menu below outputted:

(Example for Z80)
Z80 TEST SEQUENCE MODE

| |
|---|
| 0 EDIT |
| 1 EXECUTE |
| 2 DISPLAY |
| 3 PRINT |
| 4 DELETE |

SELECT OPTION?

On Selection of:
Option '0': EDIT
Test sequences may be entered or existing ones edited. This involves combining together in a user specified sequence pre-programmed diagnostic and static stimulus tests. GOTO and WAIT statements are also available.
  GOTO: Loop facility to allow repeated execution.
  WAIT: Wait until <RETURN> pressed. Test sequences may therefore be customised for specific PC's. Sequences may be up to 100 lines long. Up to ten different sequences may be sorted. They are numerically identified using digits 0-9.
  Option '1': EXECUTE
  Carry out specified sequence.
  Option '2': DISPLAY
  Lists specified sequence on display.
  Option '3': PRINT
  Lists specified sequence on printer.
  Option '4': DELETE
  Remove previously stored sequence from non-volatile RAM.

B. FLOPPY DISK DRIVE TESTER OR CONFIGURING MODULE

The floppy disk drive module facilitates exercising and testing of all sizes and types of disk drives (3.5", 5.25", 8", double/single density etc.) A special feature is that drive alignment can be performed without an oscilloscope.

HARDWARE

Output latches and input buffer are used under software control to simulate all control signals.

A Z80 CTC is used to generate and verify 1F/2F read/write frequencies.

An A/D converter and peak detector is included to measure alignment waveforms.

A 2K non-volatile RAM is included to hold disk drive parameters for future use.

Interconnection to the unit under test is via a ribbon cable and a suitable card edge or IDC connector for the particular unit. This is replaceable after a specified level of wear. Three different connectors (34 way IDC, 34 way card edge, 50 way card edge) are mounted on the ribbon cable so that separate cables are not required.

Two test probes are also connected to the output of the drive's differential amplifier. The signals from the alignment diskettes (floppy disks) are picked up using these probes.

SOFTWARE

On entry the following menu is displayed.

| FLOPPY DISK DRIVE TESTER |
|---|
| 0 FDD Set Up |
| 1 Standard Test |

-continued

| FLOPPY DISK DRIVE TESTER |
|---|
| 2 Alignment Test |
| 3 Static Stimulus Tests |

SELECT MODE?

On Selection of:
  Main Option '0': Allows user to specify the type of drive being tested. The parameters to be inputted are—drive size, number of sides, number of tracks, tracks per inch (TPI), drive number, step rate.
  Main Option '1': Causes entry to another menu:

| FLOPPY DISK DRIVE TESTER |
|---|
| 0 Seek Track n |
| 1 Alternate Seek |
| 2 Write/Verify 1F |
| 3 Write/Verify 2F |
| 4 Check Rotational Speed |
| 5 Head Load Check |

SELECT OPTION?

On Selection from this menu of:
  Option '0': Prompts for track number. On <Enter> seeks to track.
  Option '1': Prompts for two track numbers. Continually seeks between them.
  Option '2': Writes and verifies 1F frequency to current track.
  Option '3': Ditto, but 2F frequency.
  Option '4': Measure time between index pulses. Output measurement in milliseconds.
  Option '5': Operator using keypad may continually load and unload the read/write heads.
  Main Option '2': Allows drive Alignment Tests to be performed (using Dysan Analog Alignment Diskettes). Automatic digitisation of waveforms eliminates the need for an oscilloscope, and increases alignment accuracy. The type of Dysan diskette to be used is displayed. The following menu is then displayed:

| FLOPPY DISK DRIVE ALIGNMENT |
|---|
| 0 Radial Alignment |
| 1 Index Adjustment |
| 2 Azimuth Check |
| 3 TKOO Adjustment |
| 4 Read Resolution |

SELECT OPTION?

On selection of any of the above, the appropriate track on the diskette is selected and the measurement made using the digitiser. The waveforms are digitised and appropriate numerical results and error information are outputted to the display, numerically and/or graphically. The engineer may now make adjustments and watch the signal value being constantly updated on the display.

Static Stimulus Tests

Main Option '3': allows all signals to be statically stimulated and monitored. Faults may thus be traced to component level using simple tools such as a logic probe and pulser.

C. CENTRONICS TESTER OR CONFIGURING MODULE

The Centronics module allows printers with a Centronics interface to be exercised and tested.

HARDWARE

The Centronics test configuring module consists of ROM and memory mapped input/output ports.

Figure 11:
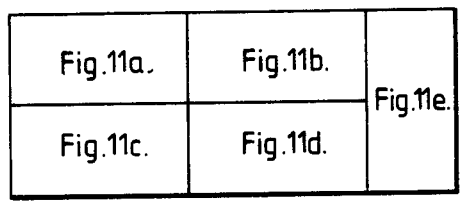

It comprises the following components and is illustrated with reference to FIG. 11 of the drawings.

4K 2732-25 EPROM labelled U2 containing control software. Address range 4000H to 5FFFH; O/P latch for data.

Latches and buffers for the following control signals, which will be implemented:
1. BUSY
2. STB
3. PAPER OUT
4. INIT
5. FAULT

OUTPUT

Data is latched out using the octal flip flop U4, at address 8000. The strobe signal and the printer initialisation signal are latched out using a dual D type flip flop, U5, at address 8002.

INPUT

Output control signals from the printer (busy, paper out, fault) are monitored by the microprocessor via a tristate buffer, U6, at address 8002. The acknowledge signal is used to toggle a JK type flip flop, U3, the output of which is read via buffer U6. The selection of address 8003 presets U3 and acknowledge clears U3.

PROCESSOR BUS

The processor bus is terminated using resistor networks and buffered using permanently enabled octal line drivers U7 and U8, in the case of output signals. The data bus is buffered using an octal transceiver, U9.

Interconnection to the printer under test is via a cable terminating in a 36-way delta plug. The cable may be replaced after a specified period of use.

SOFTWARE

On power-up the following menu is outputted.

| CENTRONICS PRINTER EXERCISER |
| --- |
| 0 Output Continuous Character |
| 1 Output Character Set Once |
| 2 Output Character Set n times |
| 3 Output Specified Character n times/n lines |
| 4 Output Control Sequence |
| 5 Static Stimulus Test |

SELECT OPTION?

On option select:

Main Option '0': Continuously output full ASCII character, set CR/LF and repeat until ESC pressed.

Main Option '1': Output full ASCII character set once.

Main Option '2': Enquire from user number of times to output character set, output specified number of times.

Main Option '3': Enquire from user:
(a) Character to output
(b) Number of times to output
(c) Number of lines to output Output specified character n times/n lines.

Main Option '4': Output specified printer control sequence, (e.g. select large character set). The operator may output a programmable control sequence to a printer up to three characters in length.

Main Option '5': Allows all interface signals to be statically stimulated and monitored, e.g. data bus, strobe, initialise.

If main option 5 is selected the following menu appears:

| CENTRONICS STATIC STIMULUS TESTER | |
| --- | --- |
| 0. Data (00) | Busy = 1 |
| 1. Stb (1) | PaperOut = 1 |
| 2. Init (1) | Fault = 1 |

SELECT OPTION?

On Selection of:

Option '0': The operator may drive the data bus to the printer under test with any pattern by inputting the appropriate hexadecimal code from the keyboard.

Options '1' or '2': The associated control line (Strobe or Initialise respectively) will toggle, i.e. high line goes low and vice-versa. The operator has a continuous display of the status of these input control lines in the brackets opposite the line title. The right hand side of the screen presents the operator with a continuous display of the status of the output control lines from the printer.

D. RS232C PRINTER TEST CONFIGURING MODULE

The RS232C module allows printers with an RS232C port to be exercised and tested.

HARDWARE

Figure 12:
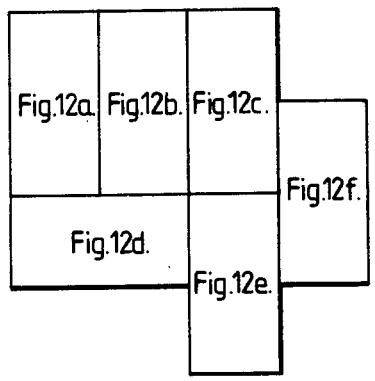
FIGS. 12 and 12a–12e show a circuit diagram for a configuring module adapted as a RS232C printer exerciser.
Figure 4A:
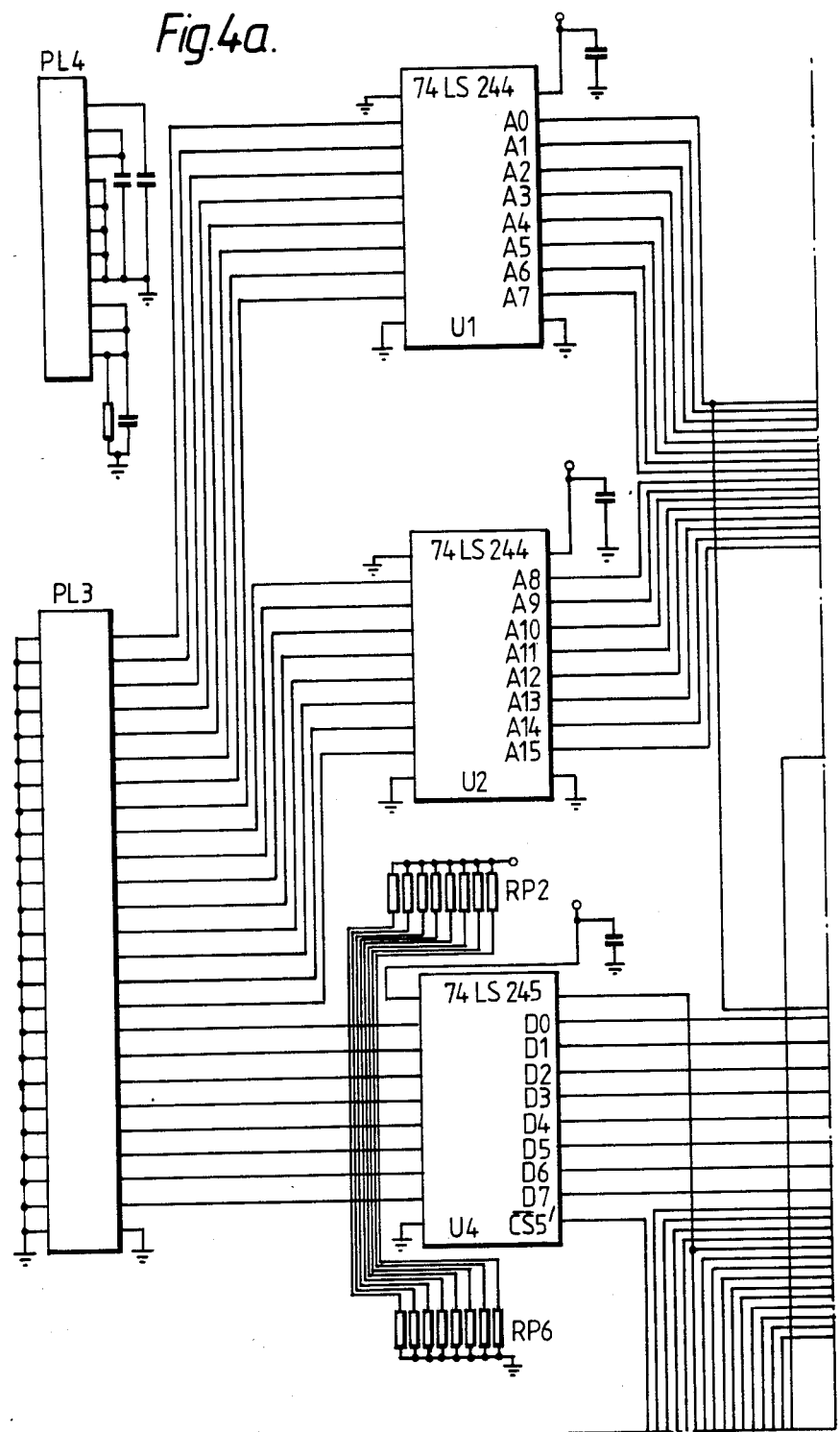
Figure 4B:
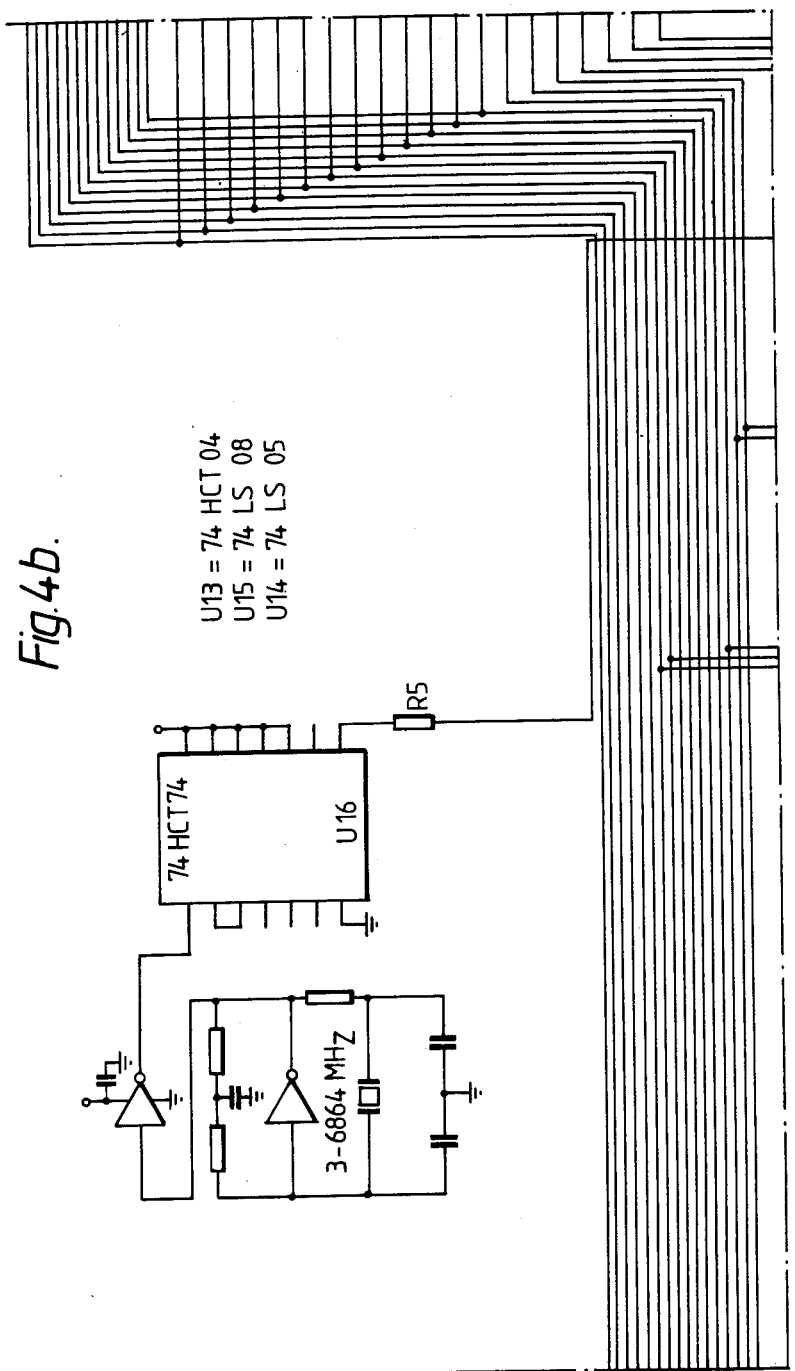
Figure 4D:
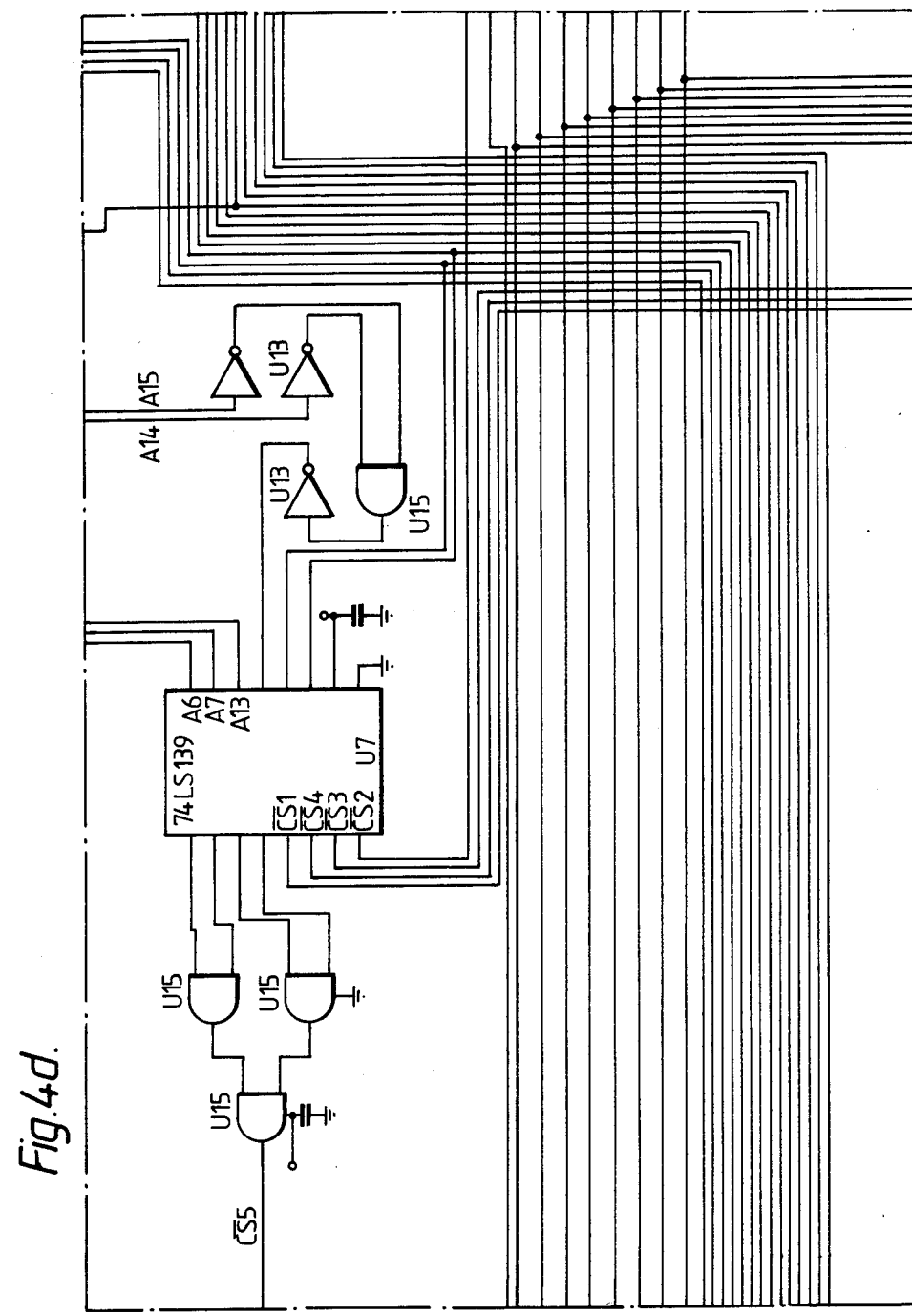
Figure 4E:
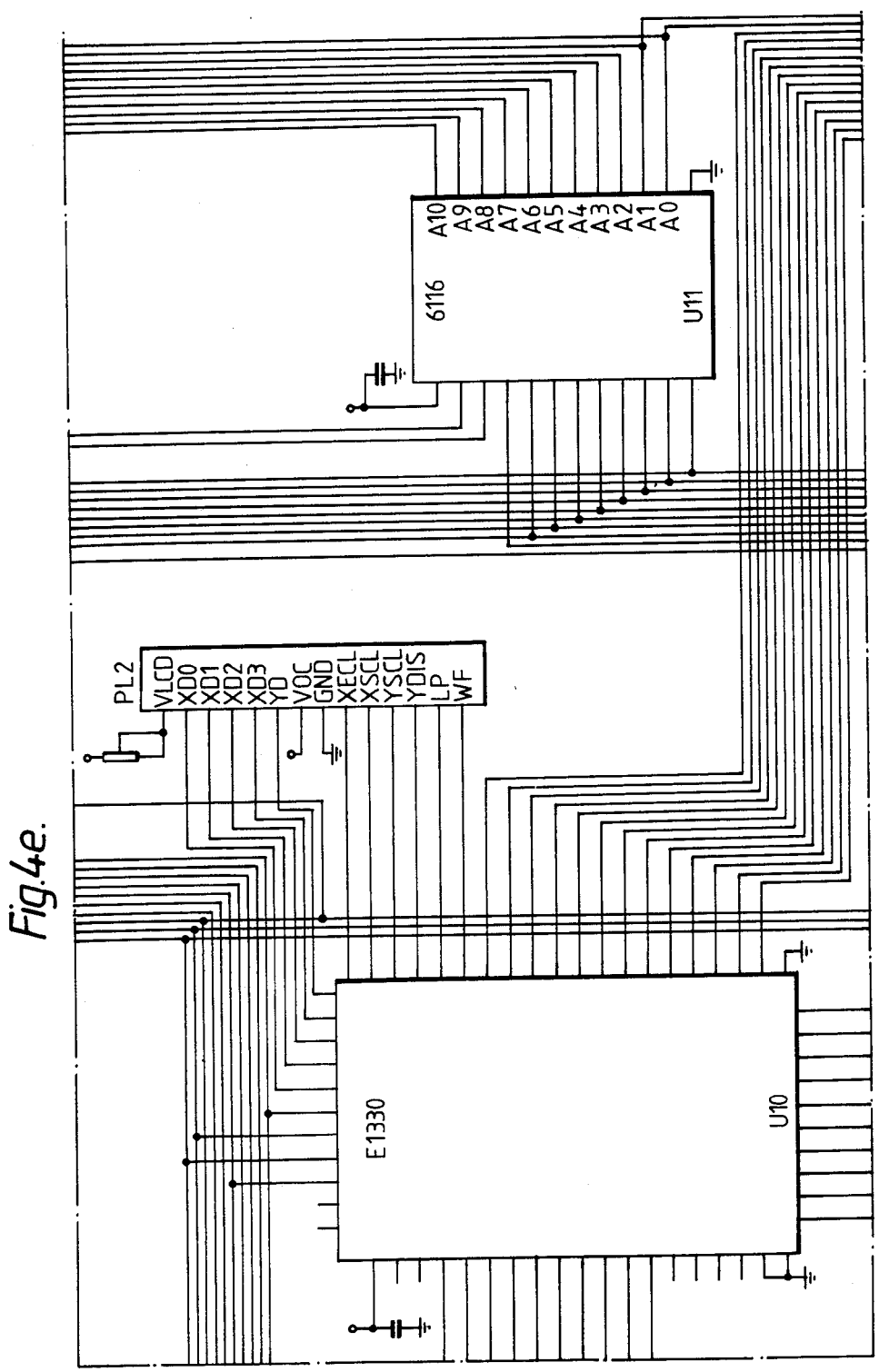
Figure 4F:
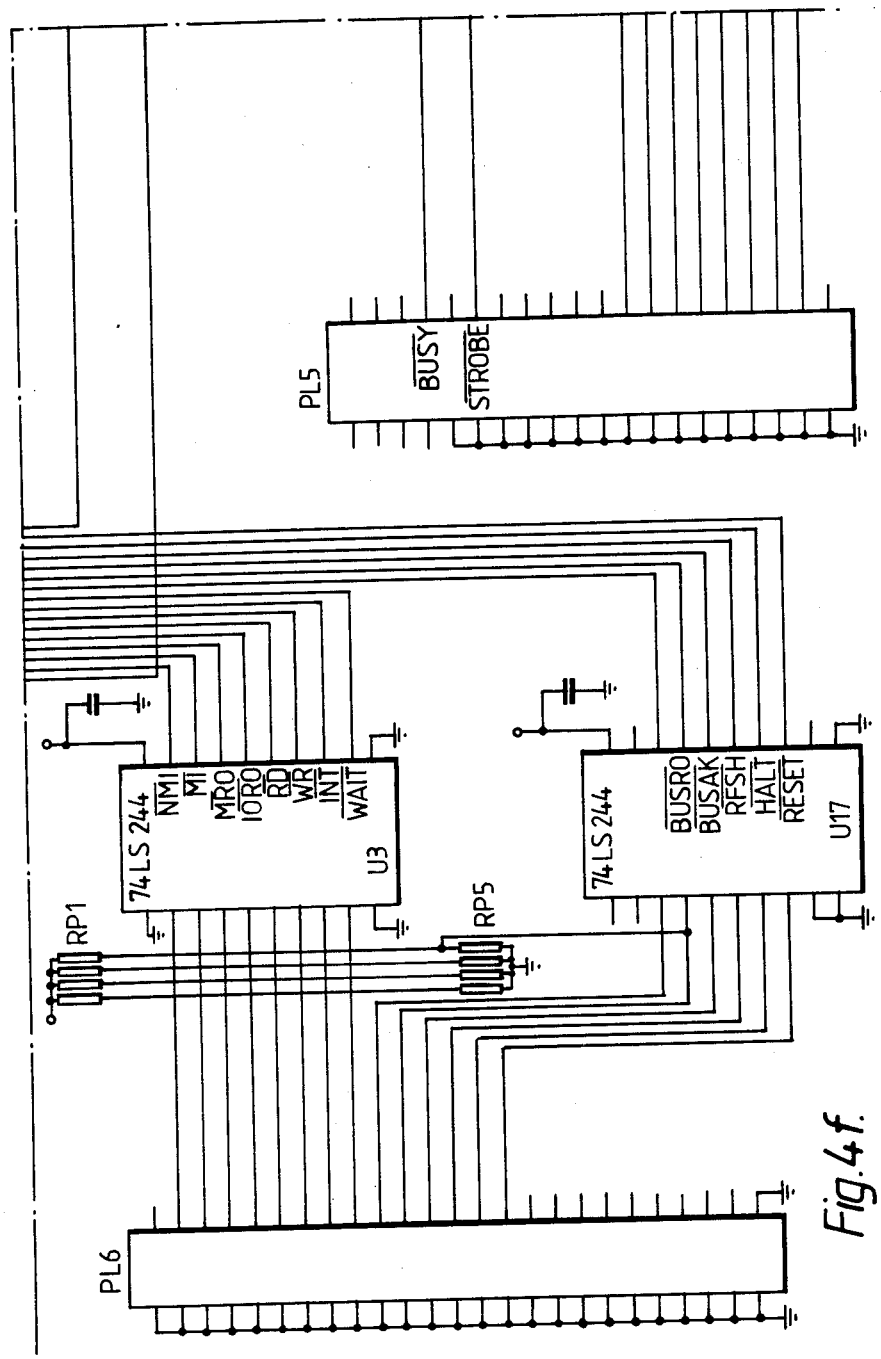
Figure 4G:
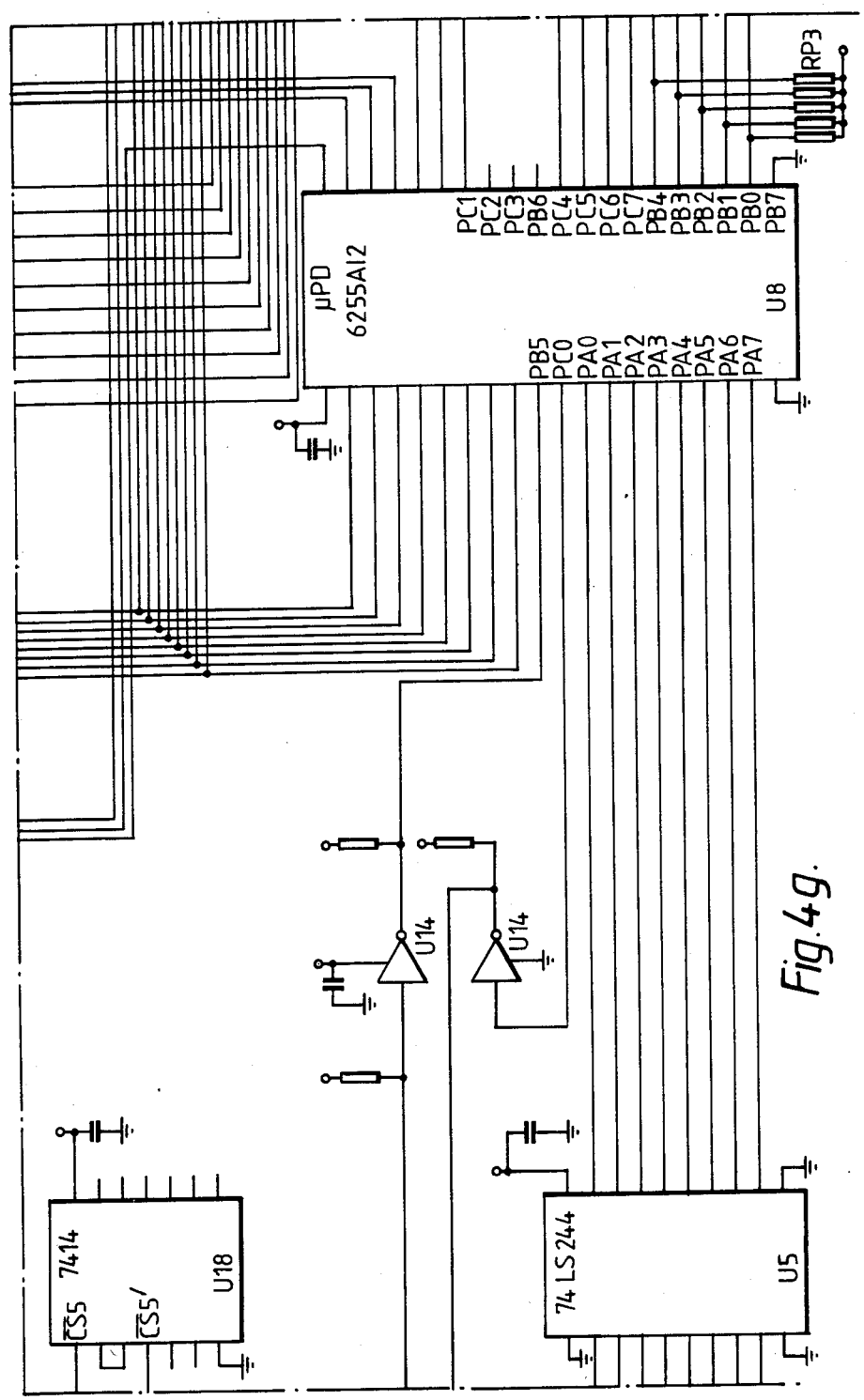
Figure 4H:
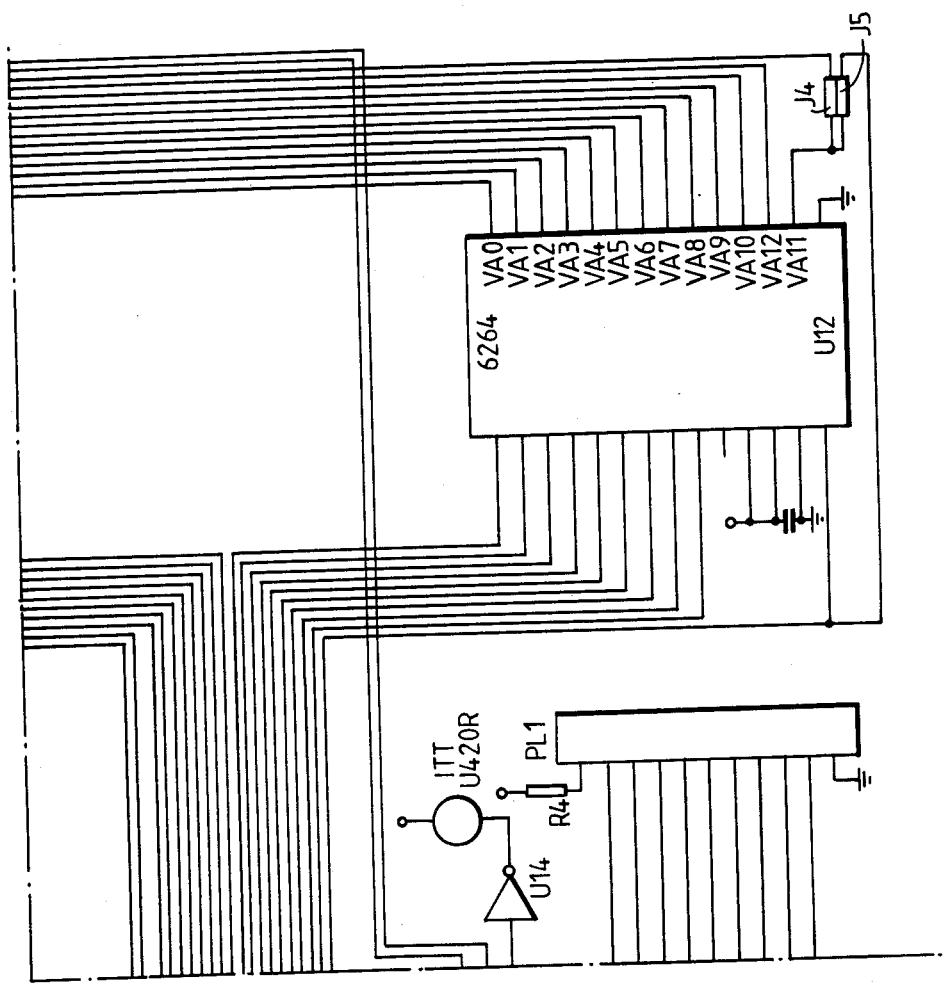
Figure 5A:
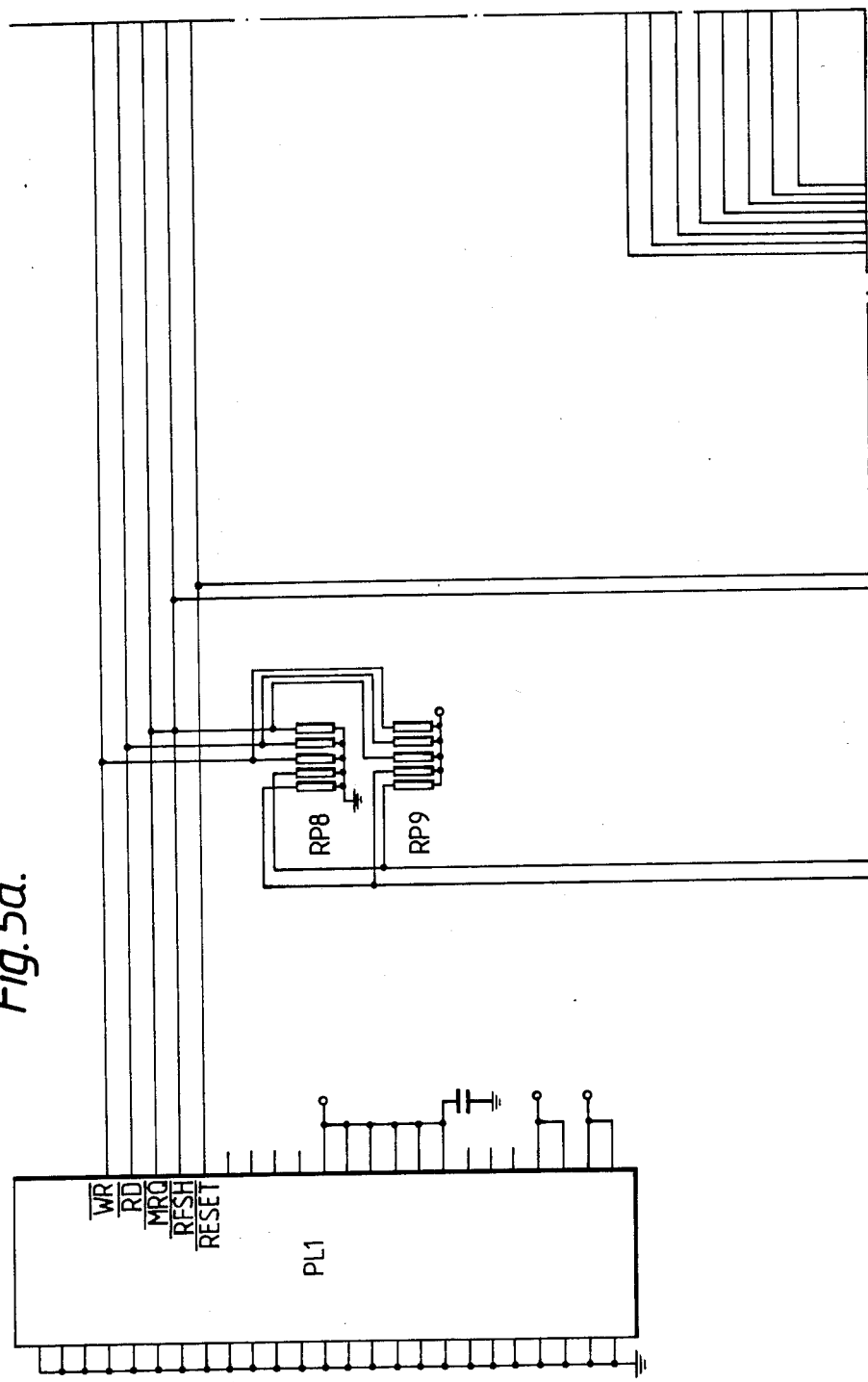
Figure 5D:
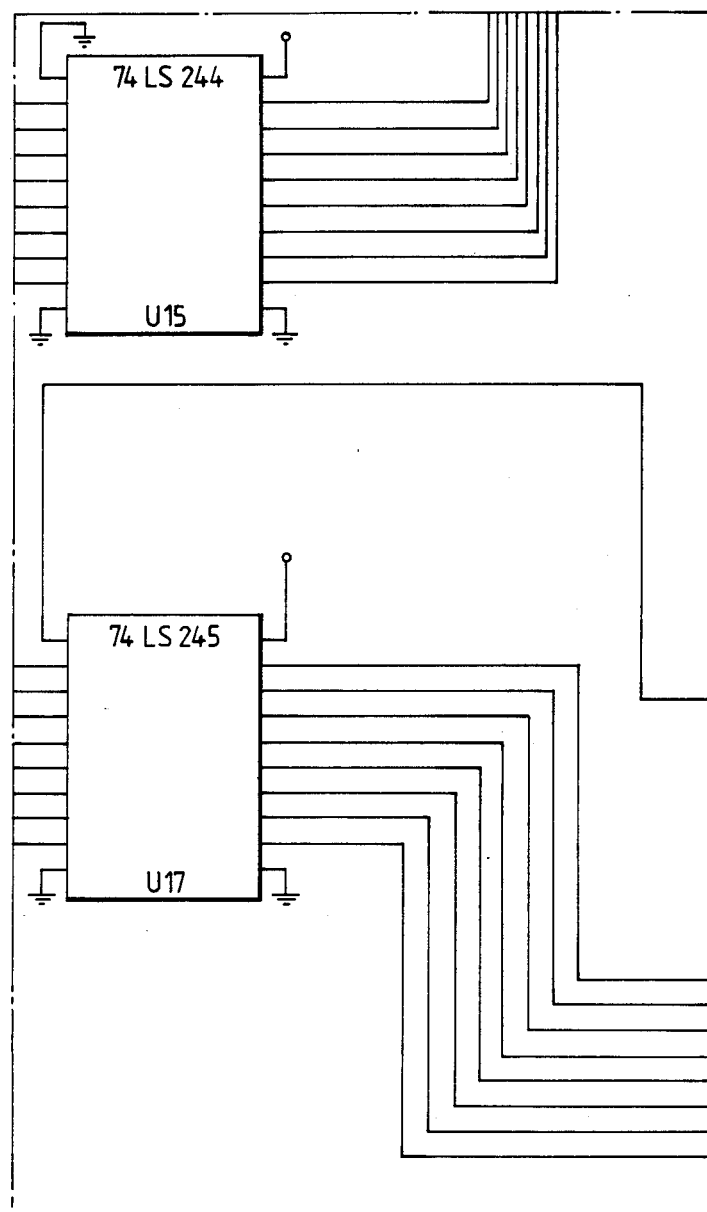
Figure 5E:
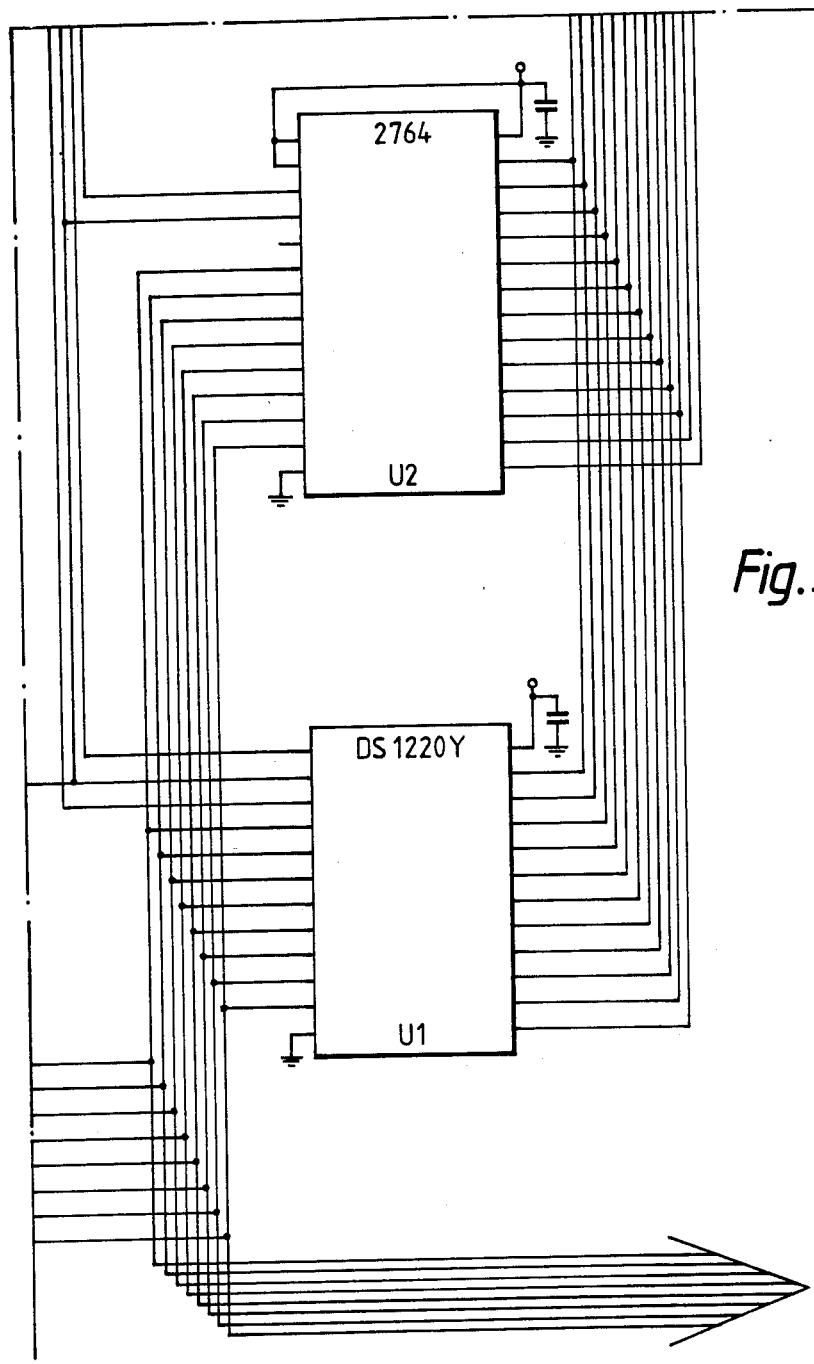
Figure 6A:
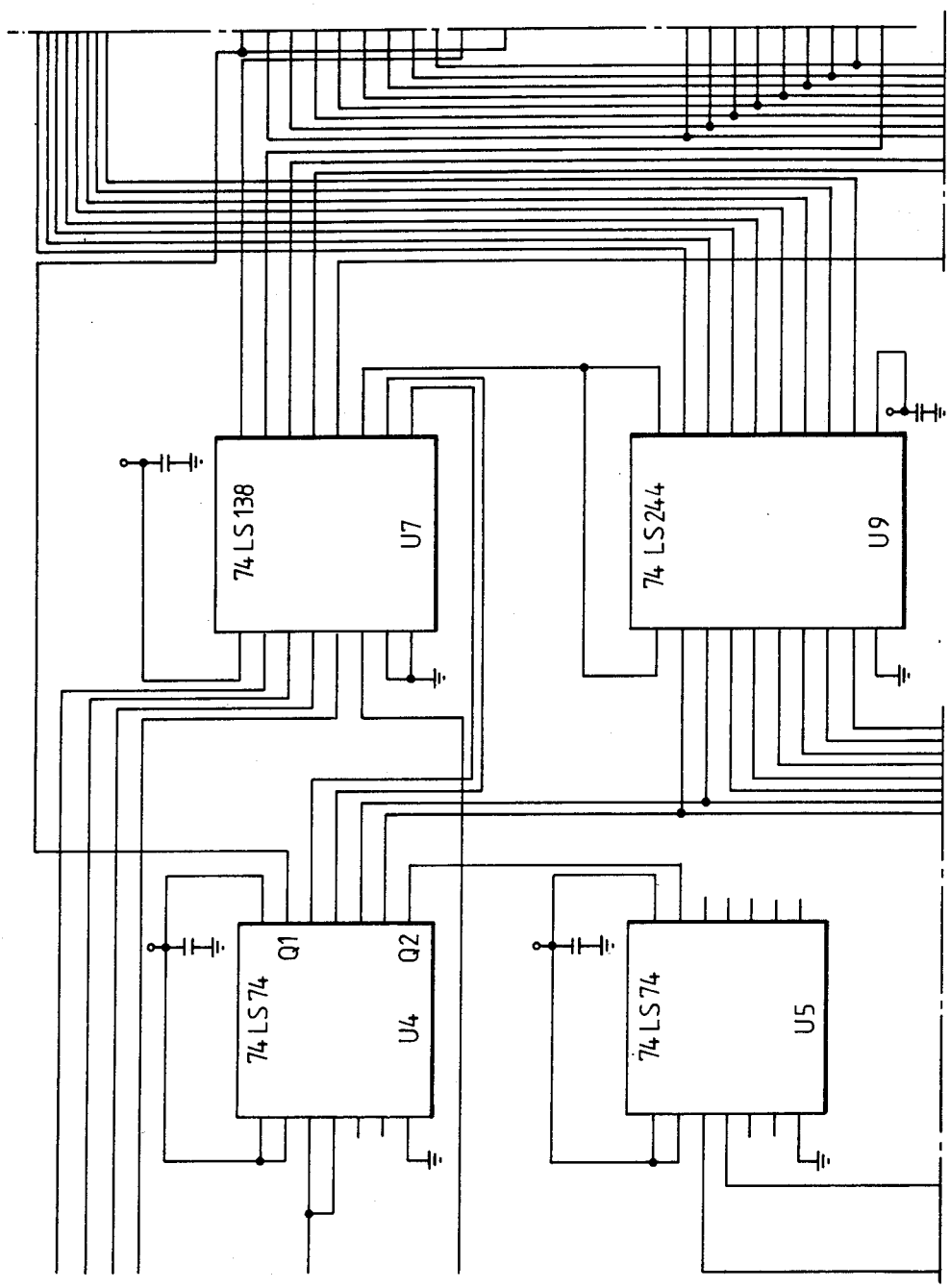
Figure 6B:
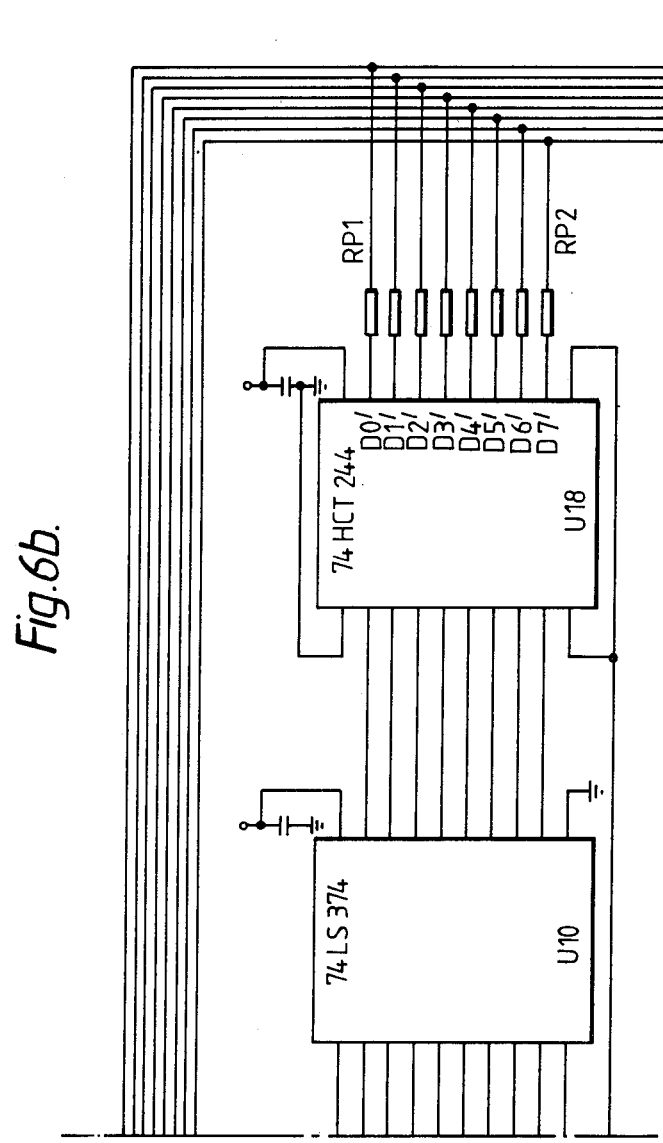
Figure 6D:
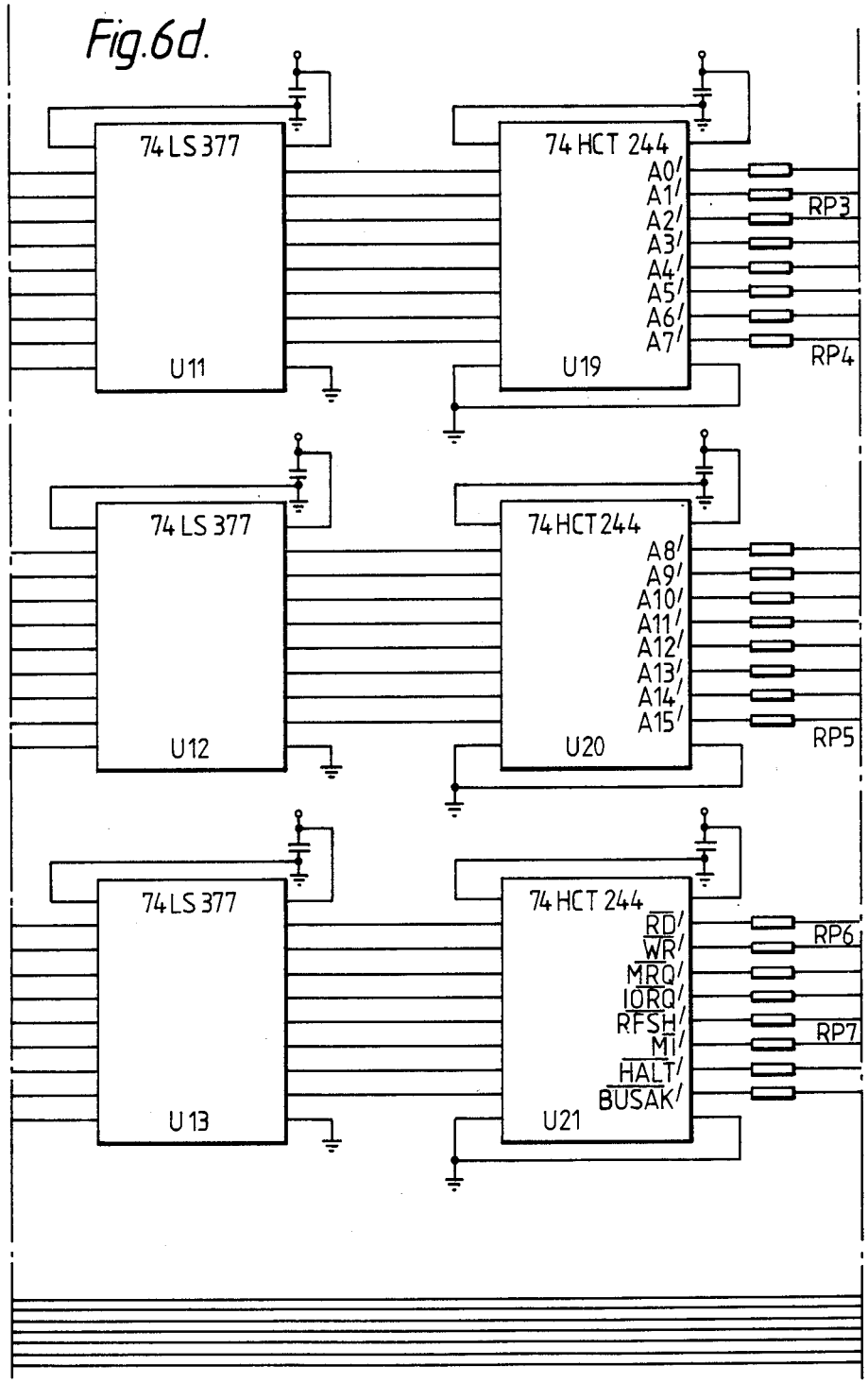
Figure 6E:
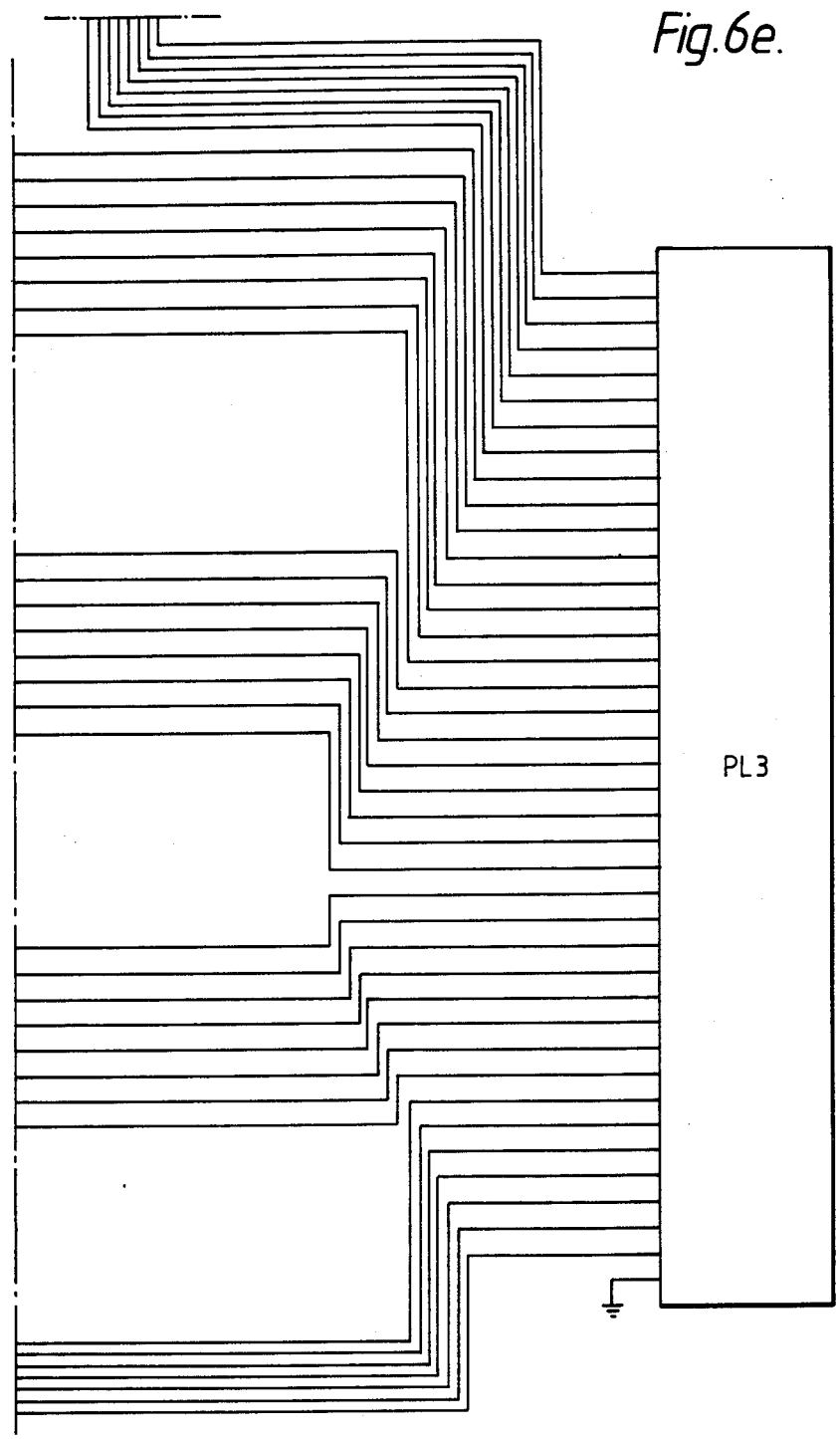
Figure 7:
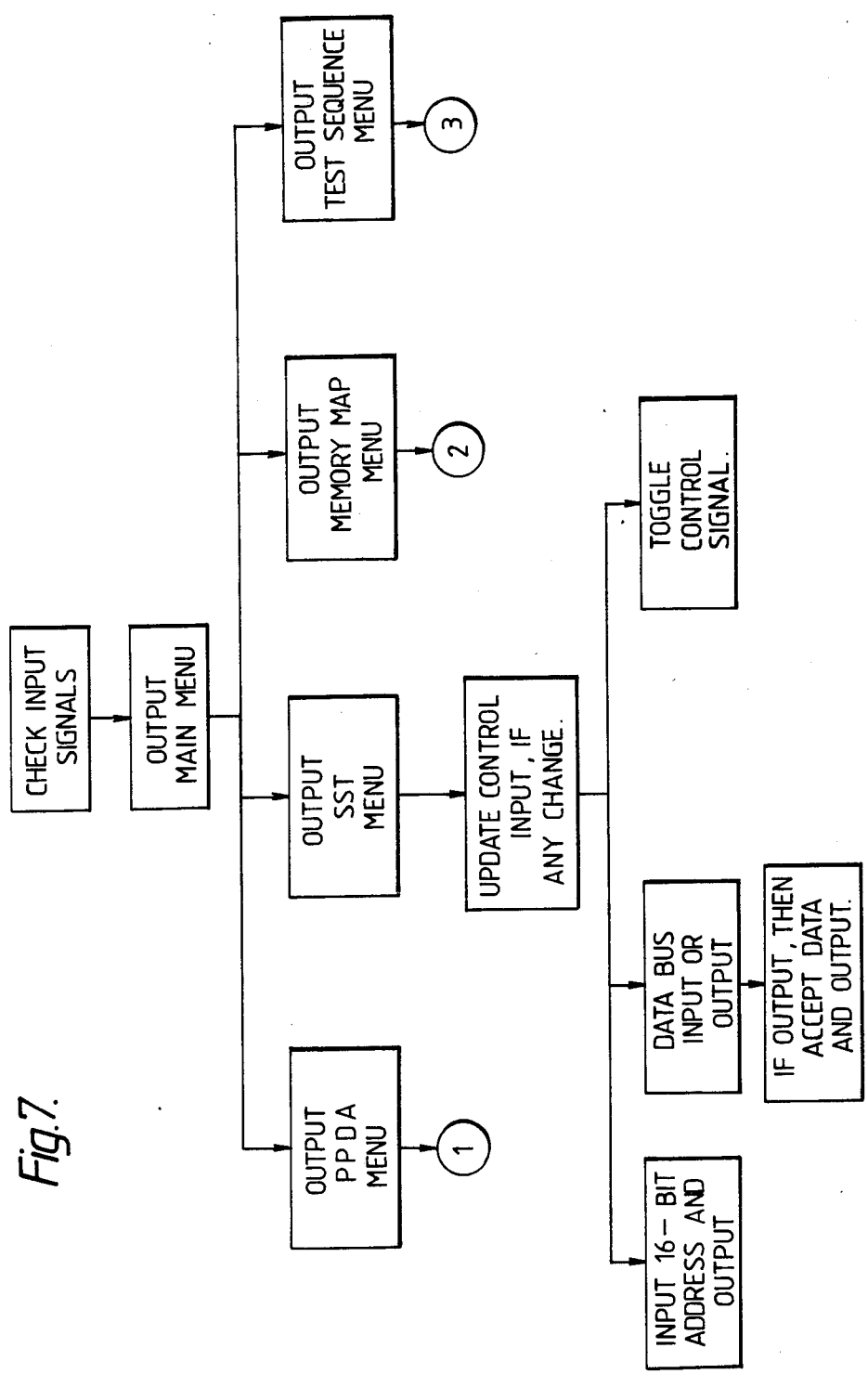
Figure 8A:
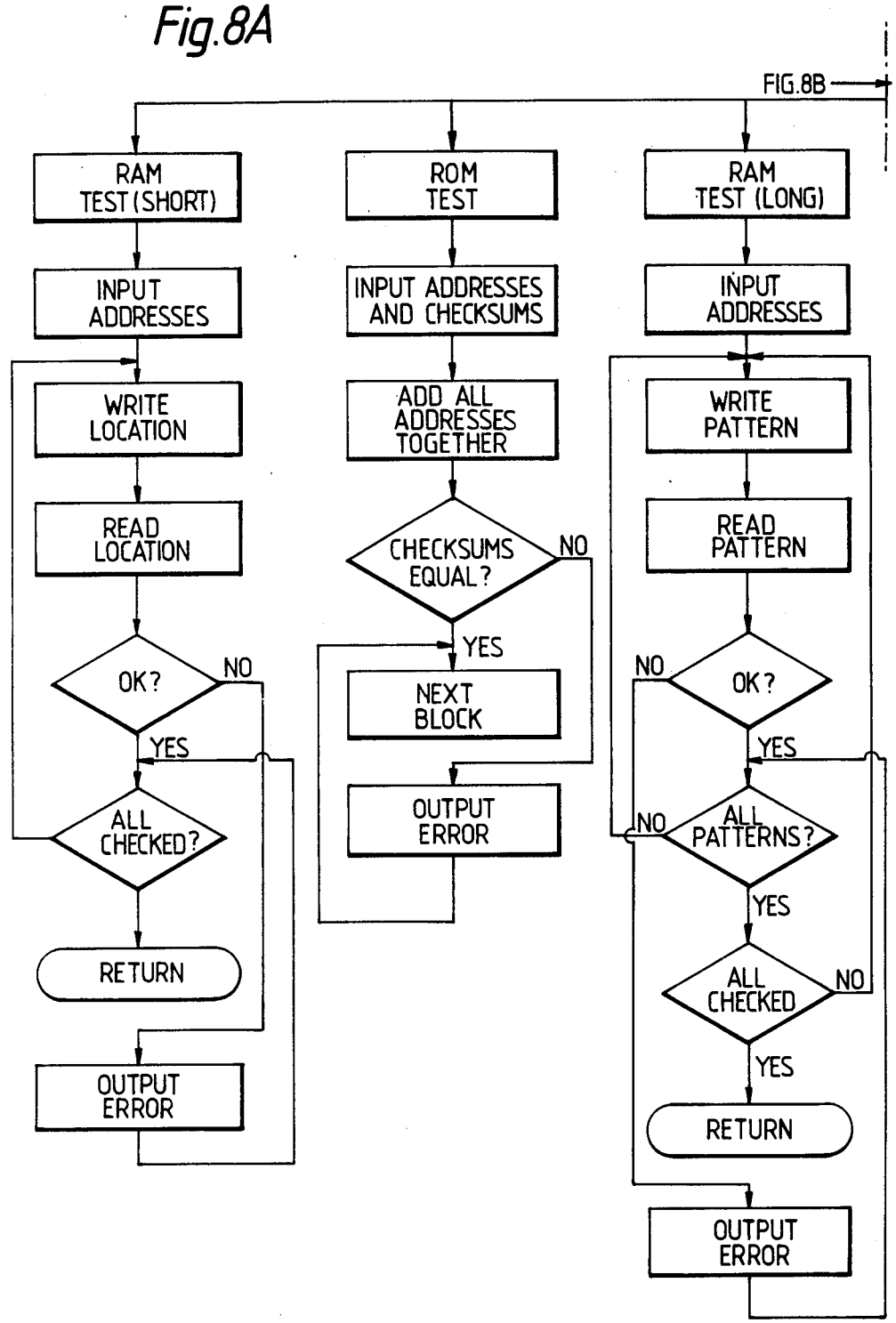
Figure 8B:
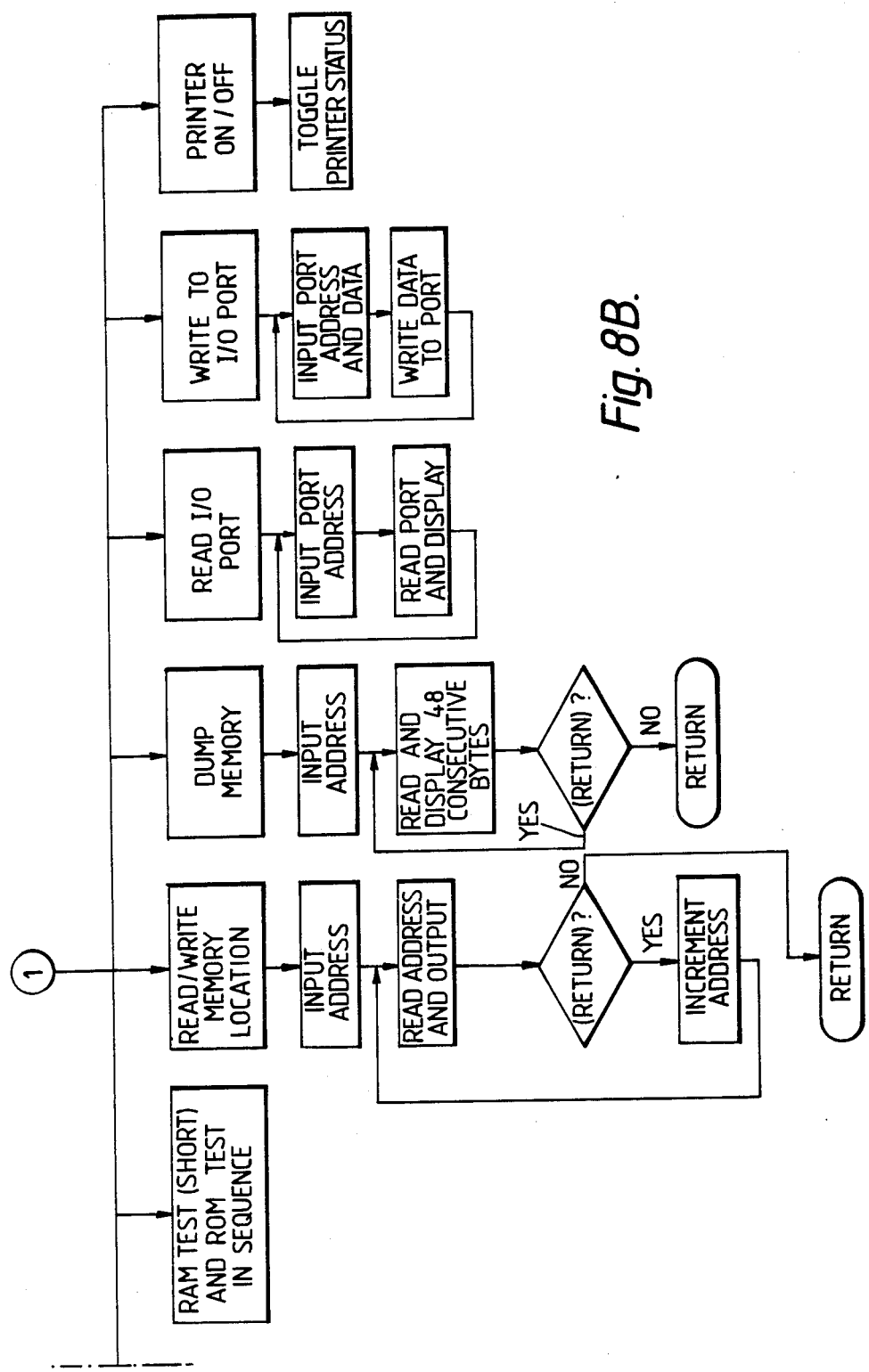
Figure 9:
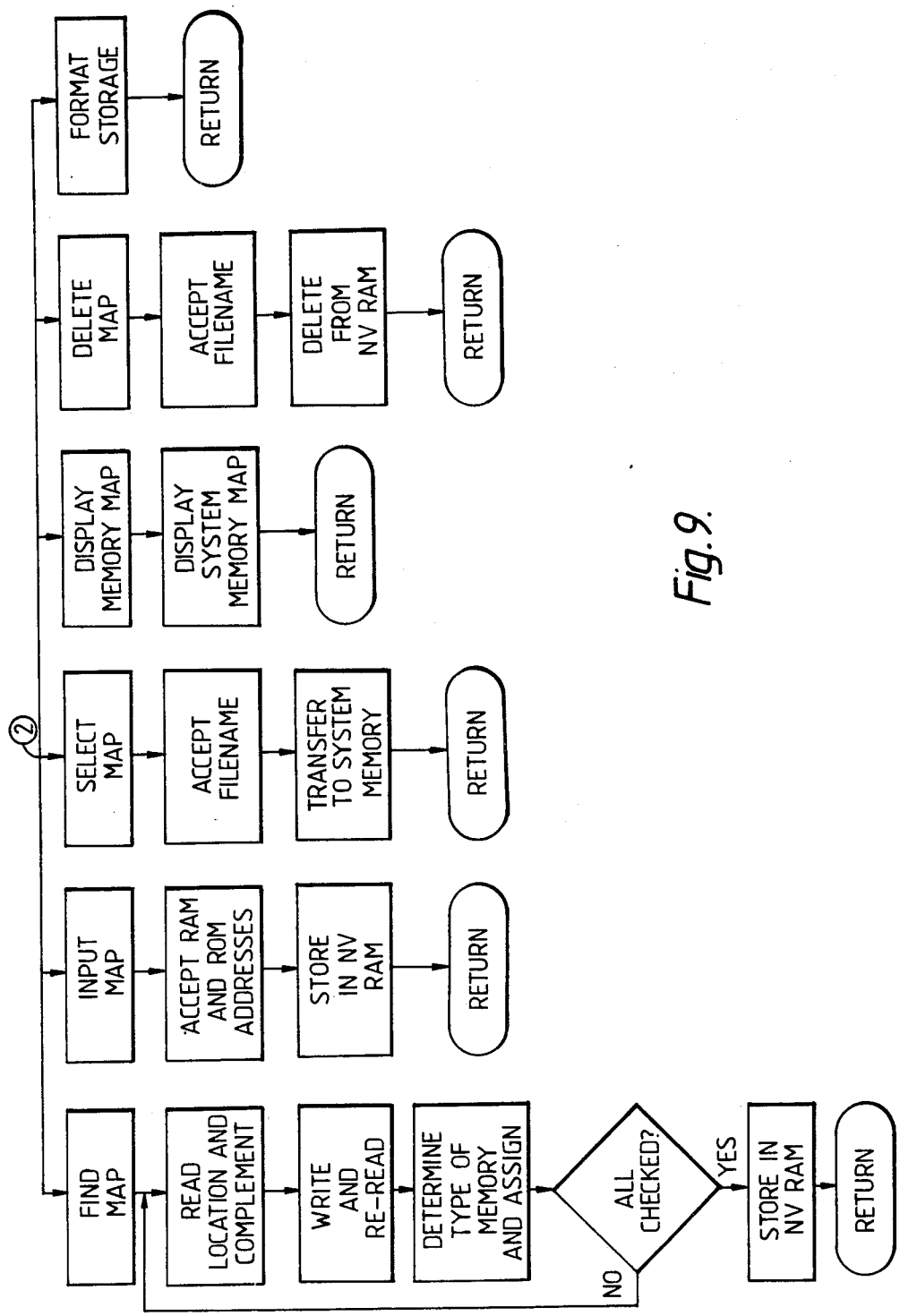
Figure 10:
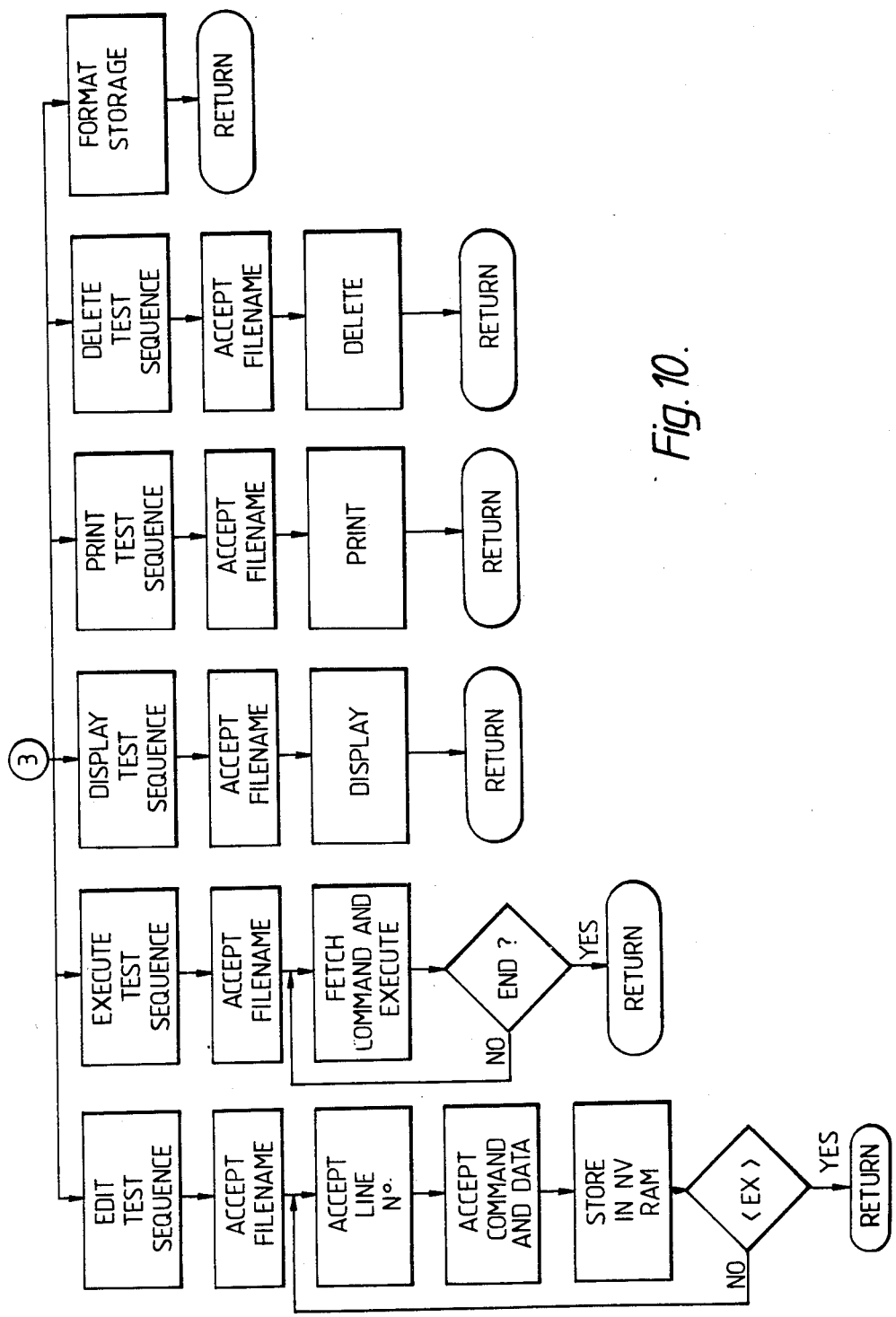
Figure 11A:
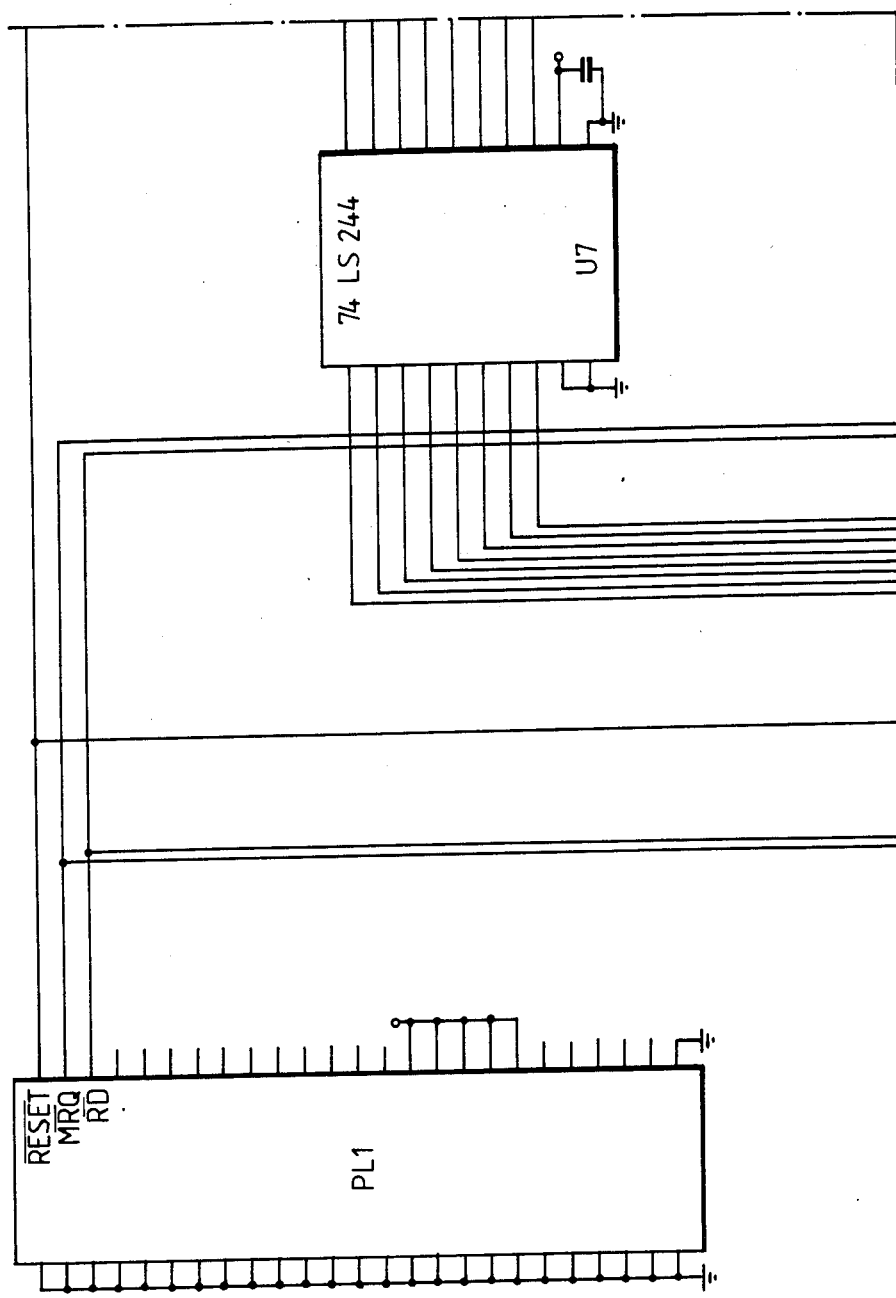
Figure 11C:
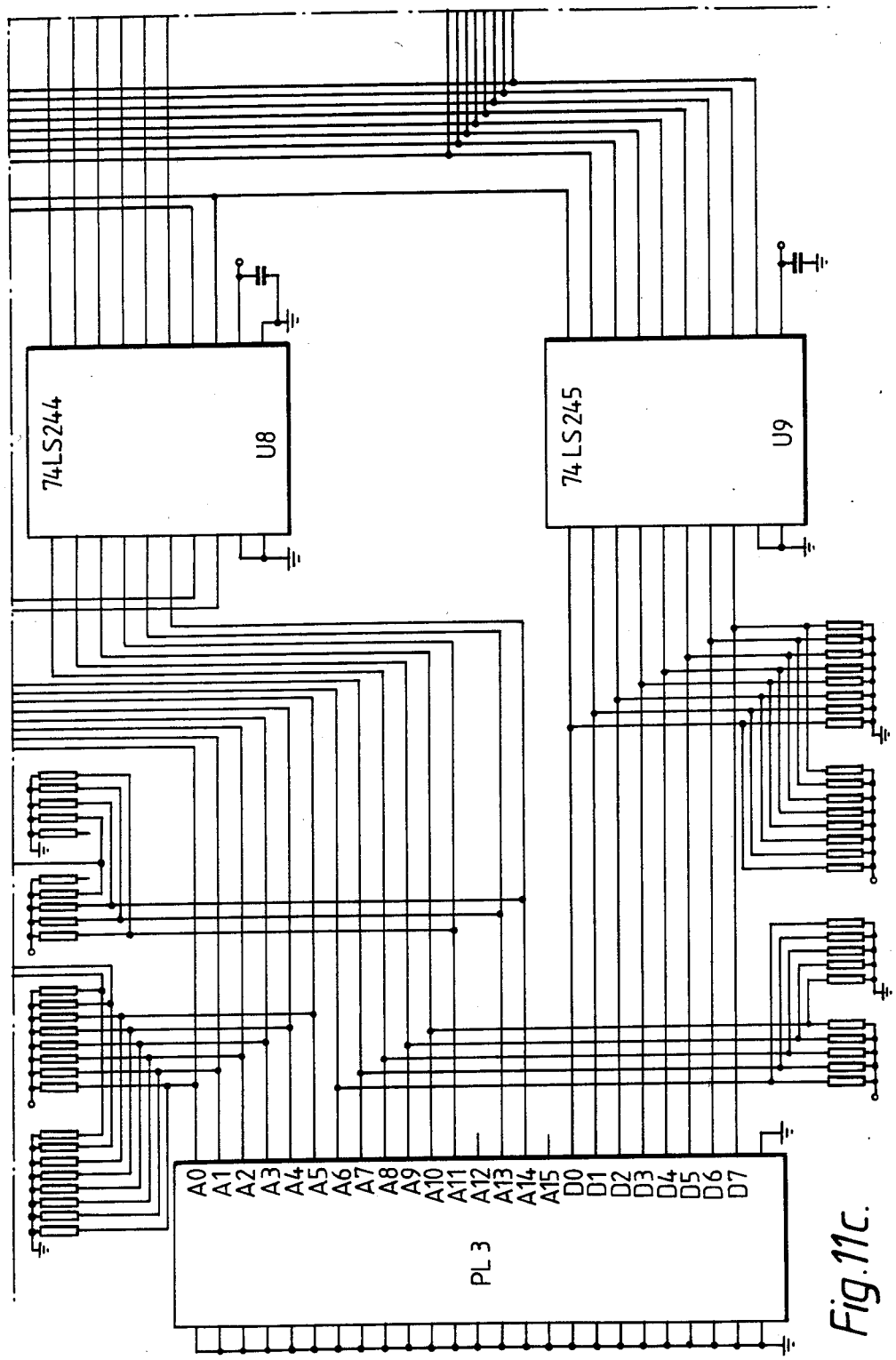
Figure 11D:
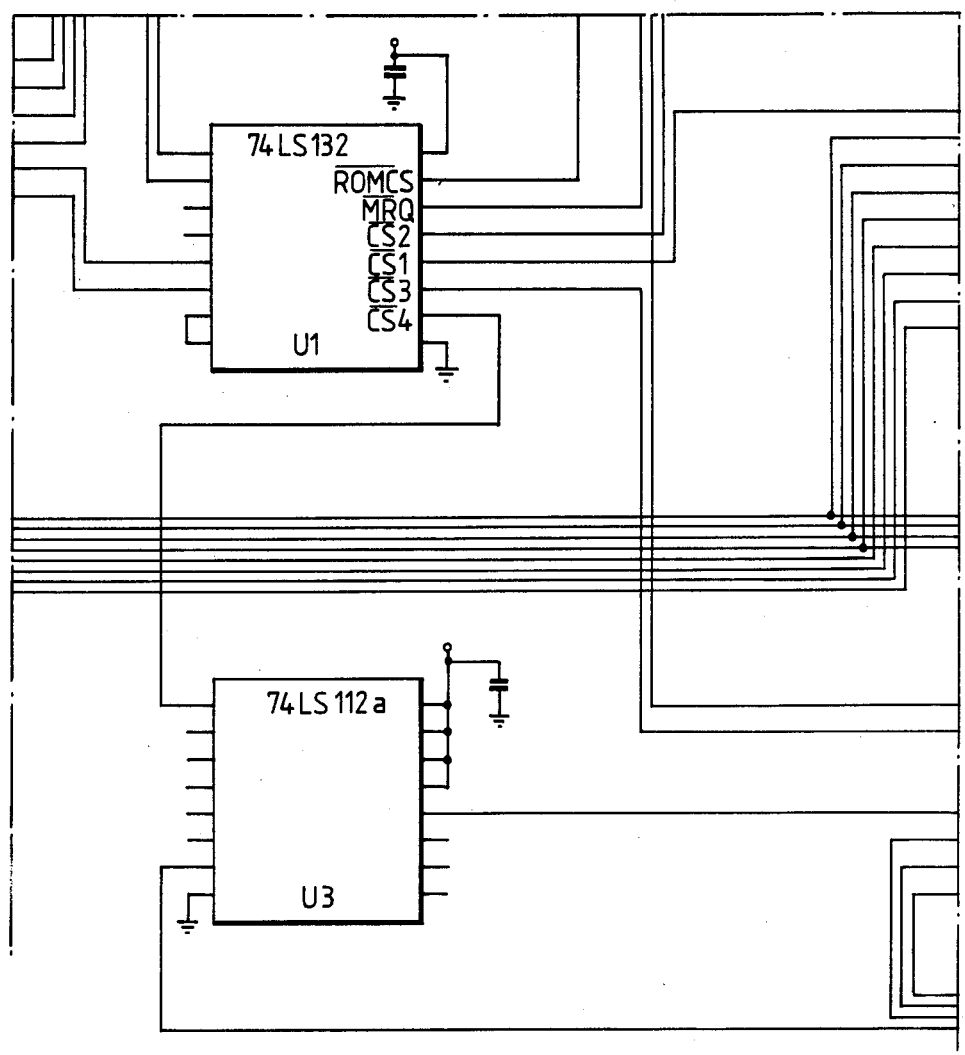
Figure 11E:
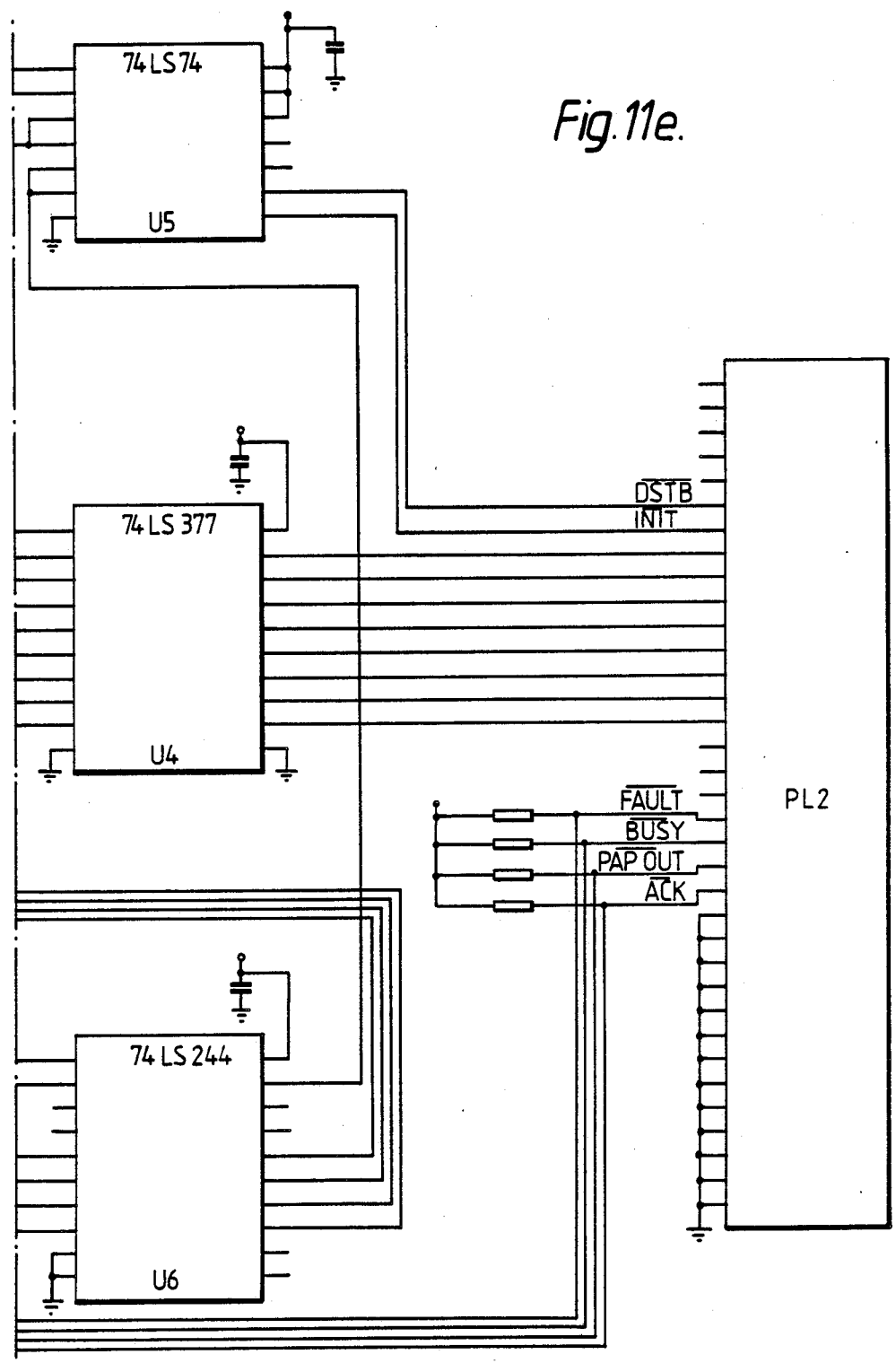
Figure 12A:
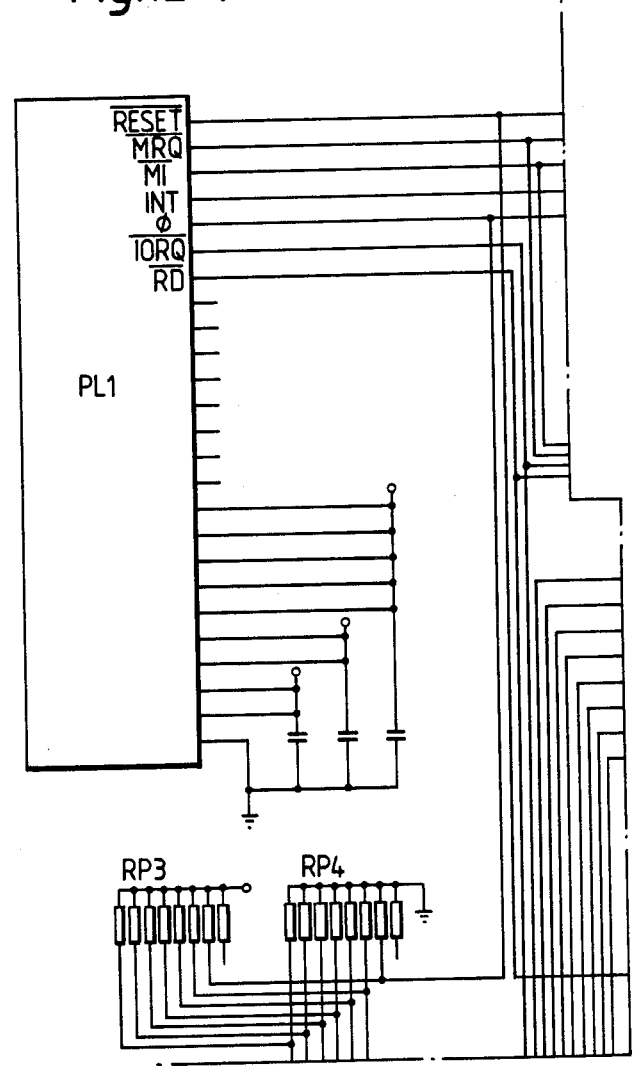
Figure 12B:
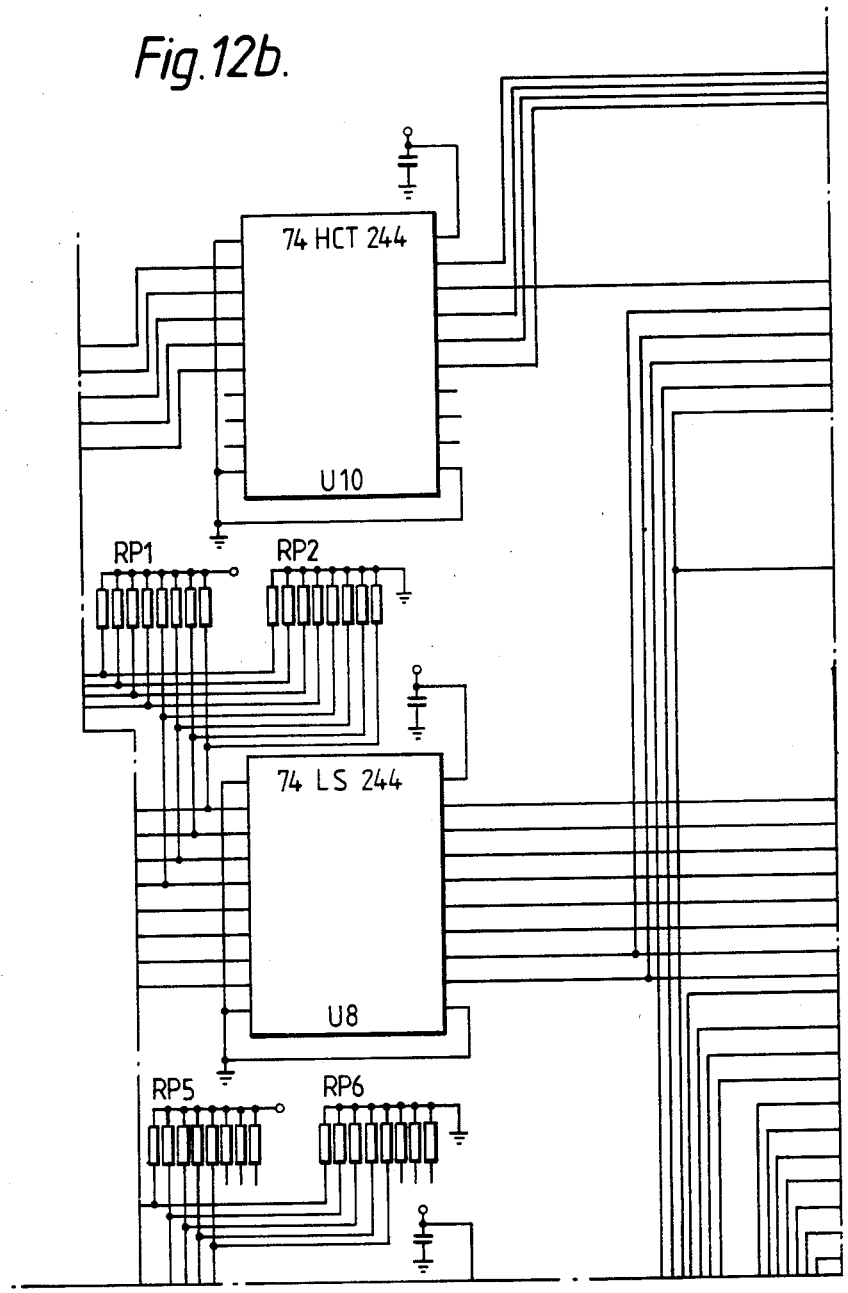
Figure 12C:
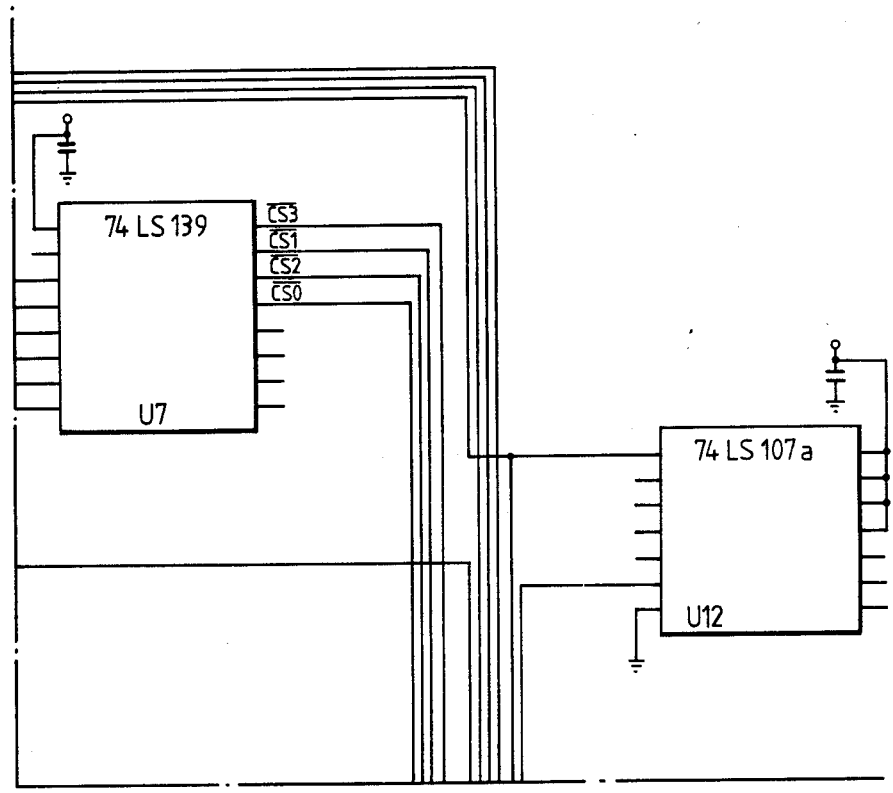
Figure 12D:
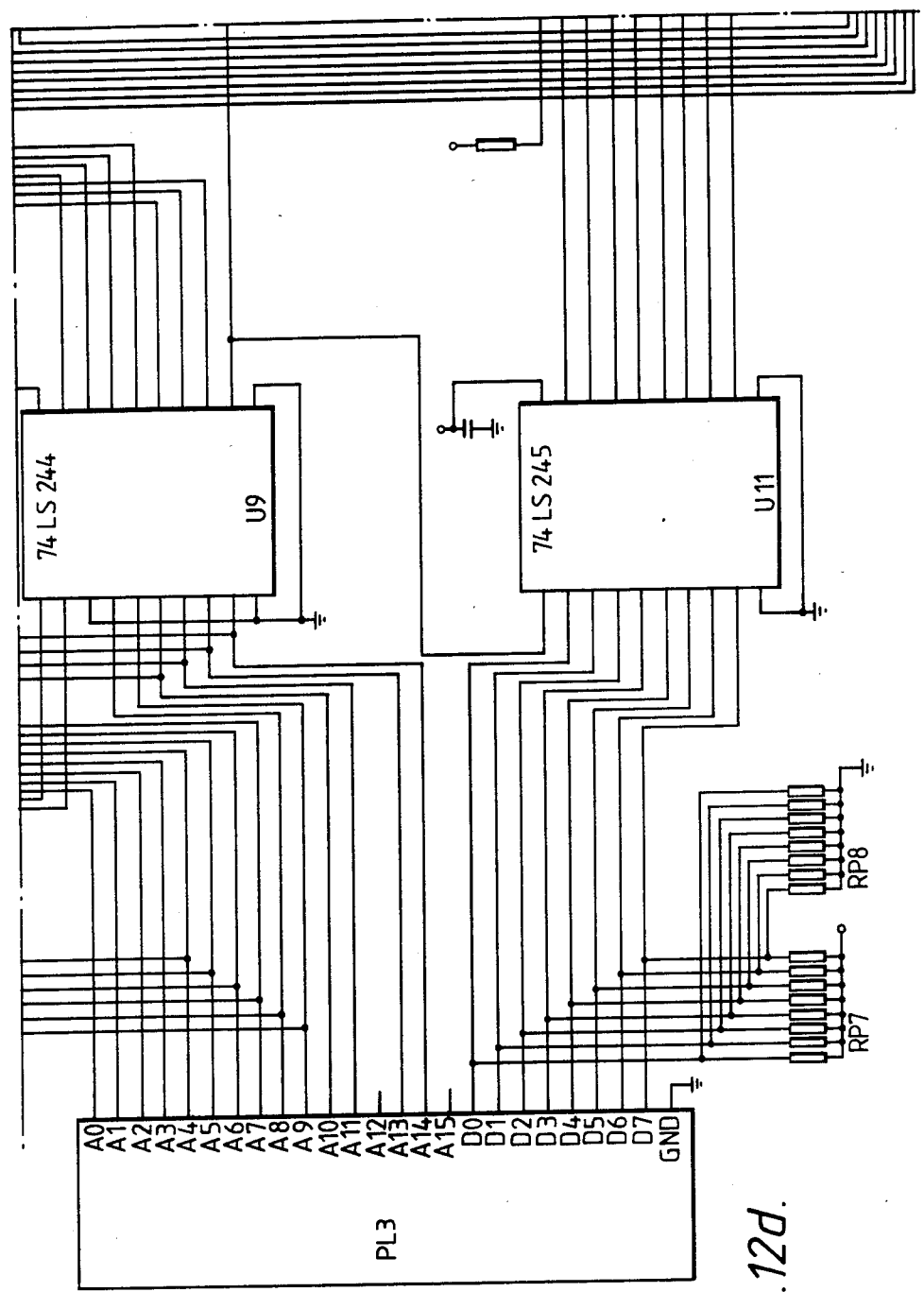
Figure 12E:
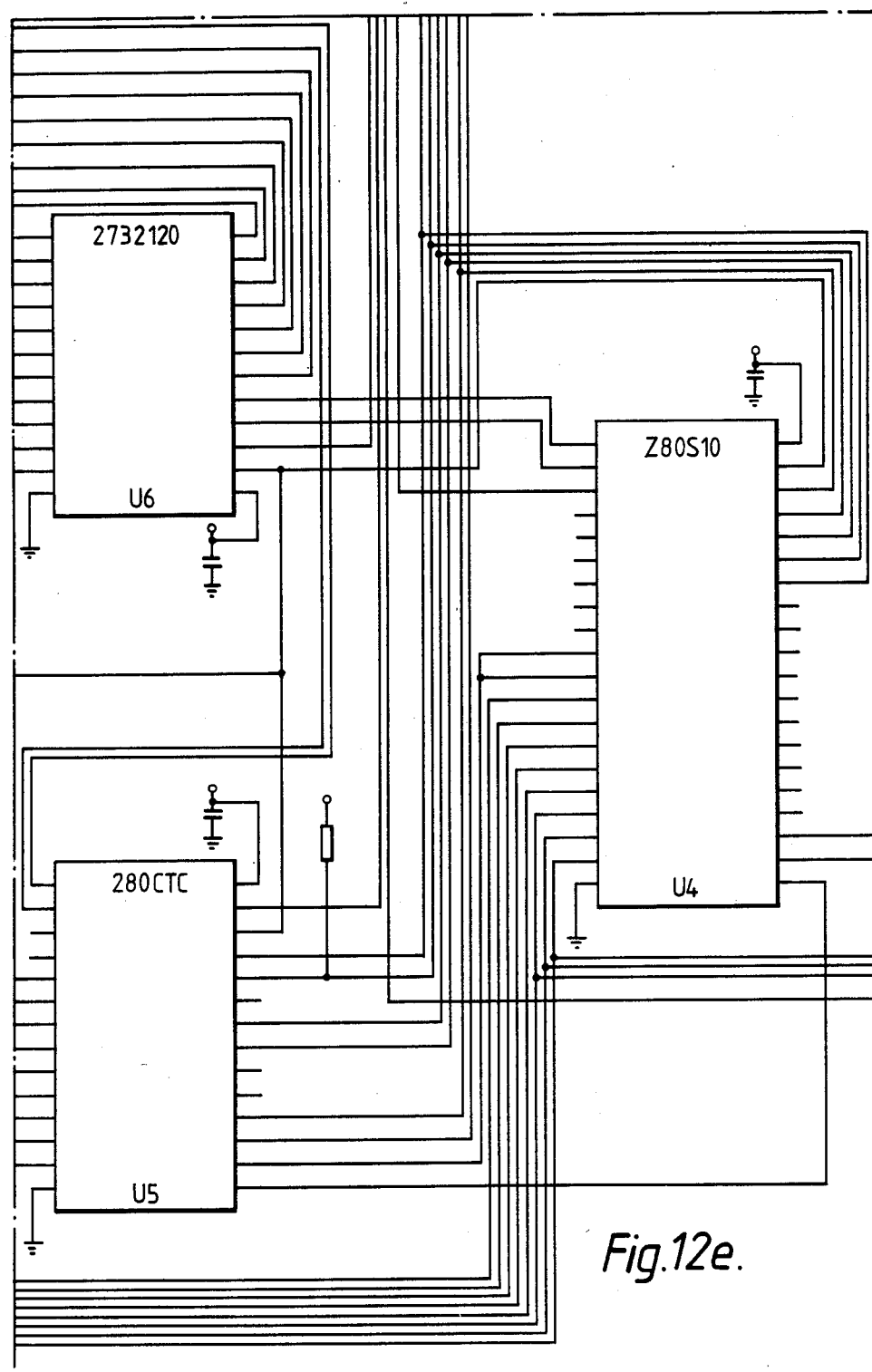
Figure 12F:
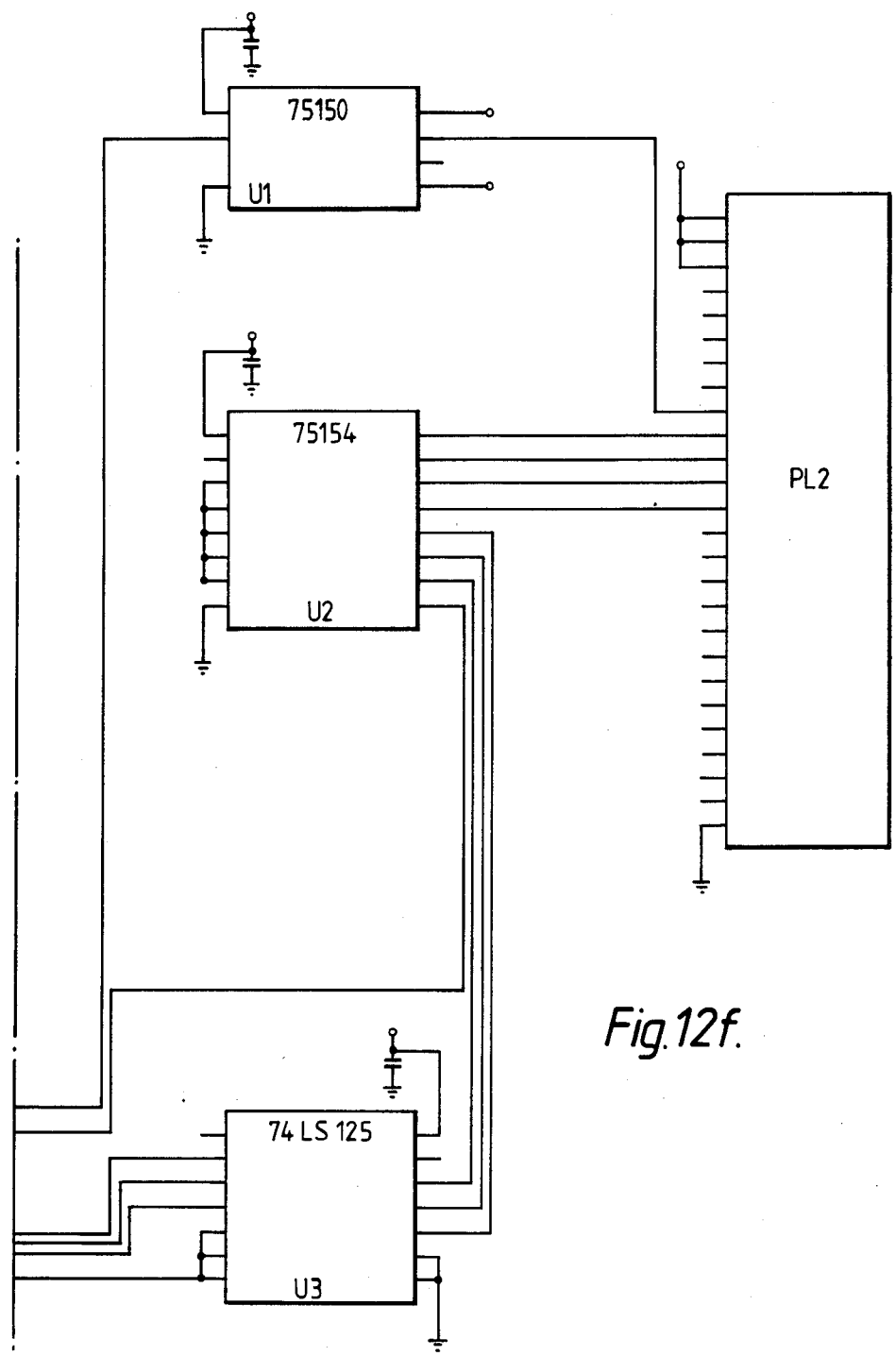

This is illustrated with reference to FIG. 12 and comprises the following components:

The RS232C printer test configuring module consists of a programmable baud rate generator, a serial I/O controller, line driver, and line receiver.

ROM U6

Address range 4000H to 5FFFH.

The software is stored on a 2732-25 EPROM, labelled U6.

CTC U5

I/O address range 80H to BFH.

The CTC is used to generate the frequency required for the serial controller. The variable frequency is under software control. The maximum clock frequency in the counter mode is one half of the system frequency. U12 is a JK flip flop used to divide the system clock.

Serial I/O controller U4.

I/O address range C0H to FFH.

The serial I/O controller is a Z80A SIO.

DRIVERS/RECEIVERS

The output of the SIO is buffered with a RS232C type line receiver U2. The control signals from the printer are also buffered by U2. These control signals are monitored by the microprocessor via tristate buffers, U3, at address 8000H.

The printer being assumed to be a DTE, the following signals are implemented:

| Pin 2: | Tx | |
|---|---|---|
| Pin 3: | Rx | |
| Pin 4: | RTS | |
| Pin 11: | — | (sometimes printer busy) |
| Pin 20: | DTR | |

PROCESSOR BUS

The processor bus is terminated using resistor networks and buffered using permanently enabled octal line drivers U8, U9 and U10, in the case of output signals. The data bus is buffered using an octal transceiver, U11.

The Z80 S10is used as the serial port. The Z80 CTC is used to generate the necessary baud rate. Standard RS232C drivers/receivers are used with ±12 V. to buffer all signals Software is contained in the 4K EPROM.

Connection to the printer may be via a 25 pin D-connector. This is easily replaceable after the prescribed period of use.

SOFTWARE

On power up the following menu is entered: RS232C PRINTER EXCERCISER

```
0 Output continuous character set.
1 Output character set once.
2 Output character set n times.
3 Output specified n times/n lines.
4 Output control sequence.
5 Printer Set-Up.
```

SELECT OPTION?

The user keys the required option.
On Selection of:
Main Options '0'–'4': These tests are exactly the same as with the Centronics tester or configuring module except input/output is serial as opposed to parallel.
Main Option '5': If this option is selected the operator is presented with a "set-up" menu to set up printer type, as follows:

| RS232C PRINTER SET-UP | |
|---|---|
| 0. Baud Rate (300) | 4. Busy Signal (xxxx) |
| 1. Data bits (5) | |
| 2. Stop bits (1) | |
| 3. Parity (even) | |

SELECT OPTION?

This allows the following parameter to be set up:
(a) Baud Rate
(b) No. of data bits
(c) No. of stop bits
(d) Type of parity
(e) Type of handshaking.
These options are now examined.
Option '0': Baud Rate:

This option allows the operator to set up the module to the appropriate baud rate for the printer under test.

If this option is selected the operator is prompted to select the appropriate baud-rate using the arrow keys. The operator may choose from the following baud-rates: 50, 75, 110, 150, 300, 600, 1200, 2400, 4800, 9600, 19,200.

Using the arrow keys advances and reverses the display through this range of baud rates.

OPTION '1': Data Bits:
This option allows the operator to set up the module to the appropriate number of data bits for the printer under test. The arrow keys are used to select 5, 6, 7 or 8 data bits.

OPTION '2': Stop Bits:
This option allows the operator to set the module to the appropriate number of stop-bits for the printer under test. The arrow keys are used to select 1, 1.5 or 2 stop bits.

OPTION '3': Parity:
This option allows the operator to set the module to the appropriate parity type (if any). The arrow keys are used to select odd, even or no parity.

OPTION '4': Busy Signal:
This option allows the operator to set the module to recognise hardware or software busy signals. The arrow keys are used to select one of the following types of handshake.

| | |
|---|---|
| .Xon/Xoff | Software |
| .RTS .DTR .PIN 11 | } Hardware |

The three 'hardware' options allow the operator to specify which line is recognised as the 'busy' line.

In all of the above tests, two indications will be given of success of failure of a test, viz:
1. A visual indication.
2. An audible indication.

The visual indications are fully self-explanatory LCD screen messages.

The audible indicator is a piezo-electric sounder. The following convention has been adapted for audible indications:
*One 'beep' indicates successful test completed.
*Two 'beeps' indicates unsuccessful test completed.

We claim:
1. Portable test apparatus for tracing faults in electronic equipment including or associated with a microprocessor, comprising
   (a) a control means,
   (b) a test configuring means,
   (c) means for data transfer between the control means and the test configuring means, and
   (d) means for data transfer between the test configuring means and a unit under test,
said control means comprising a microprocessor, data storage means, means for data transfer between said data storage means and said microprocessor of the control means, input command means, means for data transfer between said input command means and said microprocessor of the control means, output display means, and means for data transfer between said microprocessor of the control means and said output display means, said data storage means of the control means including read only memory means containing data to be accessed by said microprocessor of the control means for all test operations, and said input command means including a keyboard; and said test configuring means comprising data storage means and input/output means for controlling data transfer between the test configuring means and the microprocessor of the control means and for controlling data transfer between the test configuring means and the unit under test, said data storage means of the test configuring means including read only memory means containing data to be accessed by said microprocessor of the control means for diagnostic tests specific to a particular type of unit under test.

2. Portable test apparatus as claimed in claim 1, wherein
said test configuring means is interchangeable with any one of a plurality of test configuring means, each of said plurality of test configuring means containing read only memory means programmed to contain a range of diagnostic tests specific to a particular type of unit under test.

3. Portable test apparatus as claimed in claim 1, wherein
said means for data transfer between the control means and the test configuring means includes a multiwire cable removably connectible to the control means and semi-permanently connected to the test configuring means, and
said means for data transfer between the test configuring means and the unit under test includes a multiwire cable removably connectible to said unit under test and semi-permanently connected to the test configuring means.

4. Portable test apparatus as claimed in claim 1, wherein
the test configuring means is programmed to contain a range of preprogrammed diagnostic tests selected from: RAM test (short), ROM test, I/O test, RAM test (long), R/W memory, Dump memory, Read I/O location, Write I/O location.

5. Portable test apparatus as claimed in claim 1, wherein
the test configuring means is programmed to contain a range of static stimulus tests to drive normally dynamic signal lines in the unit under test with a static pattern whose effects may be examined in order to trace a fault in the unit to component level.

6. Portable test apparatus as claimed in claim 1, wherein said test configuring means is interchangeable with any one of a plurality of test configuring means, each one of said plurality of test configuring means being adapted to configure the apparatus to test a different type of unit under test, said unit under test being selected from
microcomputers, based on any one of the following microprocessors: Z80, 8088, 6502, 6800, 6802, 6809, 8048, 8080, 8085, 8086, 9900 and 68000,
and peripheral devices including
floppy disk drives,
Winchester (hard) disk drives,
printers with a Centronics interface,
printers with an RS232C port,
data communications equipment,
data communications testers (all protocols),
data communications links, including IEEE 488 buses,
other test apparatus for microprocessors,
modem testers, and
LAN analysers.

7. Portable test apparatus for tracing faults in electronic equipment including or associated with a microprocessor,
(a) a control means
(b) a test configuring means selected from a plurality of test configuring means, each of said plurality of test configuring means containing read only memory means programmed to contain a range of diagnostic tests specific to a particular type of unit under test,
(c) means for data transfer between the control means and the test configuring means, and
(d) means for data transfer between the test configuring means and a unit under test,
said control means comprising a microprocessor, data storage means, means for data transfer between said data storage means and said microprocessor of the control means, input command means, means for data transfer between said input command means and said microprocessor of the control means, output display means, and means for data transfer between said microprocessor of the control means and said output display means, said data storage means of the control means including read only memory means containing data to be accessed by said microprocessor of the control means for all test operations, and said input command means including a keyboard; and said test configuring means comprising data storage means and input/output means for controlling data transfer between the test configuring means and the microprocessor of the control means and for controlling data transfer between the test configuring means and the unit under test, said data storage means of the test configuring means including read only memory means containing data to be accessed by said microprocessor of the control means for diagnostic tests specific to a particular type of unit under test.

* * * * *